United States Patent
Momii et al.

(10) Patent No.: US 7,250,821 B2
(45) Date of Patent: Jul. 31, 2007

(54) SEMICONDUCTOR INTEGRATED CIRCUIT

(75) Inventors: Masato Momii, Chitose (JP); Naoki Yada, Tokorozawa (JP); Masaru Iwabuchi, Sagamihara (JP)

(73) Assignee: Renesas Technology Corp., Tokyo (JP)

( * ) Notice: Subject to any disclaimer, the term of this patent is extended or adjusted under 35 U.S.C. 154(b) by 91 days.

(21) Appl. No.: 11/188,873

(22) Filed: Jul. 26, 2005

(65) Prior Publication Data

US 2006/0017510 A1  Jan. 26, 2006

(30) Foreign Application Priority Data

Jul. 26, 2004 (JP) ............................. 2004-217233

(51) Int. Cl.
*H03L 7/085* (2006.01)
(52) U.S. Cl. ........................................ 331/1 A; 331/17
(58) Field of Classification Search ................. 331/1 A
See application file for complete search history.

(56) References Cited

U.S. PATENT DOCUMENTS

| 6,201,448 | B1* | 3/2001 | Tam et al. ..................... 331/25 |
| 6,433,645 | B1* | 8/2002 | Mann et al. .................... 331/18 |
| 2001/0044702 | A1* | 11/2001 | Rocchi et al. ............... 702/107 |
| 2002/0177267 | A1* | 11/2002 | Beer et al. ................... 438/200 |
| 2003/0214362 | A1* | 11/2003 | Gauthier et al. ............. 331/185 |
| 2004/0033793 | A1* | 2/2004 | Gauthier et al. ......... 455/180.3 |
| 2004/0090273 | A1* | 5/2004 | Chang et al. .................. 331/16 |
| 2006/0227650 | A1 | 10/2006 | Yada et al. |

FOREIGN PATENT DOCUMENTS

| JP | 10-187273 | 7/1998 |
| JP | 11-510938 | 9/1999 |

* cited by examiner

*Primary Examiner*—Joseph Chang
(74) *Attorney, Agent, or Firm*—Antonelli, Terry, Stout & Kraus, LLP.

(57) ABSTRACT

A semiconductor integrated circuit capable of performing internal oscillation with high precision is provided. The semiconductor integrated circuit has a memory circuit, an oscillator circuit for generating an internal clock signal based on control information held in the memory circuit, a logic circuit for generating control information for causing the frequency of the internal clock signal to coincide with the frequency of an external clock signal, and an electric fuse circuit or a blow fuse circuit capable of storing the control information generated in the logic circuit and uses the internal clock signal for the synchronous operation of the internal circuit. This allows, even when an error (an undesired variation) occurs in the oscillation characteristic (oscillation frequency) of the oscillator circuit due to a process variation, the frequency of the internal clock signal to coincide with the frequency of the external clock signal at a target frequency without necessitating the mounting of an external crystal oscillator or the inputting of the external clock signal.

18 Claims, 33 Drawing Sheets

FIG. 7E

| | rd | prg | set | d | cg | sl | pu | wl | n | rl | q |
|---|---|---|---|---|---|---|---|---|---|---|---|
| inh | x | 1.5 | ///// | ///// | ///// | ///// | ///// | ///// | ///// | ///// | ///// |
| data set "0" | 1.5 | x | 1.5 | 0 | 0 | 0 | 0 | 0 | x | 0 | 0 |
| data set "1" | 1.5 | x | 1.5 | 1.5 | 0 | 0 | 0 | 0 | x | 0 | 1.5 |
| erase "0" | 0 | 0 | 0 | x | 0 | 5 | 0 | 2 | 0 | 0 | 0 |
| erase "1" | 0 | 0 | 0 | x | 0 | 5 | 0 | 2 | 0 | 0 | 0 |
| prog "0" | 2 | 2 | 0 | x | 5 | 5 | 0 | 2 | −5 → 0 | 0 | 0 |
| prog "1" | 0 | 2 | 0 | x | 5 | 5 | 0 | 2 | 5 → 0 | 0 | 0 |
| read "0" | 1.5 | 0 | 0 | x | 1.5 | 0 | 1.5 | 0 | 1.5 | 0 | 2 |
| read "1" | 1.5 | 0 | 0 | x | 1.5 | 0 | 1.5 | 0 | 1.5 | 0 | 0 |
| (test) "x" | 1.5 | 0 | 0 | x | ext | 0 | 1.5 | 0 | −3 | 1.5 | 1.5 |
| hold "0" | 0 | 0 | 0 | x | 0 | 0 | 0 | 0 | x | 1/0 | 1/0 |
| hold "1" | 0 | 0 | 0 | x | 0 | 0 | 0 | 0 | x | 0 | 1.5 |

WAVEFORMS IN CONTROL OPERATION USING FUSE

SEMICONDUCTOR INTEGRATED CIRCUIT

CROSS-REFERENCE TO RELATED APPLICATION

The present application claims priority from Japanese patent application No. 2004-217233 filed on 26 Jul. 2004, the content of which is hereby incorporated by reference into this application.

BACKGROUND OF THE INVENTION

The present invention relates to an electronic circuit which is operated in synchronization with a clock. More particularly, it relates to a semiconductor integrated circuit which is operated in synchronization with a clock and to a technology which is effective when applied to an information processing apparatus represented by, e.g., a microcomputer.

Among semiconductor integrated circuits which are operated in synchronization with clocks such as microcomputers, there are some which generate synchronous clock signals only through internal oscillation without using externally mounted crystal oscillators. Patent Document 1 discloses a microcomputer which generates a synchronous clock signal only through internal oscillation without using an externally mounted crystal oscillator. Patent Document 2 discloses a circuit for trimming the oscillation frequency of an internal oscillator which conducts internal oscillation without using an externally mounted crystal oscillator.

[Patent Document 1] Japanese Unexamined Patent Publication No. Hei 11(1999)-510938

[Patent Document 2] Japanese Unexamined Patent Publication No. Hei 10(1998)-187273

SUMMARY OF THE INVENTION

The present inventors have initially examined problems encountered when an oscillator is used to generate a synchronous clock. In the case of operating a semiconductor integrated circuit by using crystal oscillation, the mounting of a capacitor element and a crystal oscillator or the like becomes necessary. This necessitates a mounting area and parts therefor. In addition, a terminal of the crystal oscillator is susceptible to external noise (EMS: Electro Magnetic Susceptibility) so that there are cases where reliability during the construction of a system for a customer presents a problem. Since charging/discharging occurs at a terminal of the semiconductor integrated circuit on which the crystal oscillator is mounted, the problem of radiation noise (EMI: Electro Magnetic Interference) occurs. On the other hand, the connection of a capacitance for waveform shaping to the terminal of the crystal oscillator increases current consumption. Further, a microcomputer termed a low pin-count microcomputer having an extremely small number of external terminal is used for a sensor or a network electric home appliance. In the case of using a low pin-count microcomputer, a reduction in the number of terminals for crystal oscillator can greatly contribute to a reduction in the number of external terminals.

The present inventors have then examined the case where an oscillator is not used for the generation of a synchronous clock. When an oscillator is not used for the generation of the synchronous clock, an oscillation frequency is significantly influenced by a process variation and varies by several tens of percents. The oscillation frequency is also influenced by a power supply voltage variation and a temperature change, though less seriously than by the process variation, and varies by ten and several percents. To establish communication, a clock accuracy of several percents is required so that it becomes necessary to construct a semiconductor integrated circuit which is resistant to an external voltage variation and an external temperature variation. For internal oscillation at a fixed frequency, a system having a microcomputer mounted thereon should be tested at a high frequency or a low frequency so that a configuration which allows a flexible frequency change even after shipment is in demand.

It is therefore an object of the present invention to provide a semiconductor integrated circuit capable of performing internal oscillation with high precision.

The above and other objects and novel features of the present invention will become apparent from the description of the present specification and the accompanying drawings.

A brief description will be given to the outline of the representative aspects of the present invention disclosed in the present application.

(1) Frequency Adjustment Using External Clock Signal Frequency as Index

A semiconductor integrated circuit according to the present invention has: a memory circuit (20); an oscillator circuit (23) for generating an internal clock signal (VCLK) based on control information held in the memory circuit; a logic circuit (2, 40) for generating control information for causing a frequency of the internal clock signal to coincide with a frequency of an external clock signal (RCLK) which is generated externally; and an electric fuse circuit or a blow fuse circuit (6cd) capable of storing the control information generated in the logic circuit and uses the internal clock signal for a synchronous operation of an internal circuit. Even when an error (an undesired variation) occurs in the oscillation characteristic (oscillation frequency) of an oscillator circuit due to a process variation, the frequency of the internal clock signal is allowed to coincide with the frequency of the external clock signal as a target frequency without necessitating the mounting of an external crystal oscillator or the inputting of the external clock signal. In short, a frequency error due to the process variation can be compensated for. The control information stored in the electric fuse circuit or the blow fuse circuit is stored (loaded) in the memory circuit and the internal clock signal is used for the synchronous operation of the internal circuit.

At this time, the electric fuse circuit can be formed with a first memory region capable of storing trimming control information for the internal clock signal and with a second memory region capable of storing other trimming control information related to the internal circuit such that the electric fuse circuit is used effectively. The other trimming information related to the internal circuit includes, e.g., trimming information for an internal dropped-voltage power supply.

The control information generated in the logic circuit is stored in the electric fuse at a final stage of an internal-oscillation-frequency setting operation.

The internal circuit contains a mask ROM (Read Only Memory) capable of storing a control program.

The control information stored in the electric fuse is stored in the memory circuit in response to an initializing operation when the power supply of the semiconductor integrated circuit or microcomputer is turned on, such as power-on reset.

On the other hand, the blow fuse circuit can be configured to include: a blow fuse for writing information which enables writing of the control information by being blown or not being blown; and a blow fuse for reference which is equivalent to an unblown state of the blow fuse for writing information and compare a current flowing in the blow fuse for writing information with a current flowing in the blow fuse for reference to form a logic output in accordance with a result of the comparison. In the arrangement, the case where an extremely small current flows as a result of, e.g., incomplete blowing of the blow fuse for writing information can be distinguished from the case where the blow fuse for writing information has not been blown.

Alternatively, the blow fuse circuit can be configured to include: a blow fuse for writing information which enables writing of the control information by being blown or not being blown; a first converter circuit for converting a current flowing in the blow fuse for writing information to a voltage; a blow fuse for reference which is equivalent to an unblown state of the blow fuse for writing information; a second converter circuit for converting a current flowing in the blow fuse for reference to a voltage; and a sense amplifier for comparing an output voltage of the first converter circuit with an output voltage of the second converter circuit.

There can be provided a voltage application pad capable of energizing the blow fuse for writing information, a first transistor capable of cutting off a path from the blow fuse for writing information to the first converter circuit during a period during which the blow fuse for writing information is energized via the voltage application pad, and a second transistor capable of cutting off a path from the blow fuse for reference to the second converter circuit in association with the first transistor.

At this time, there can be provided a fist resistance between the first transistor and the first converter circuit and a second resistance between the second transistor and the second converter circuit. For the stabilization of a voltage comparing operation in the sense amplifier, a value of the second resistance is set to be larger than a value of the first resistance, whereby an unblown fuse is prevented from being erroneously judged to be blown.

The voltage application pad can be formed in a scribe area destroyed through the dicing of a wafer.

On the peripheral portion of the region of the wafer to be formed with a semiconductor integrated circuit chip, a guard ring area for protecting the chip is formed and different wiring layers are connected to each other by a contact for providing conduction in the guard ring area.

The acquisition of control information for causing the frequency of the internal clock signal to coincide with the target frequency of the external clock signal can be performed in response to an indication of a specified operation mode. If the specified operation mode is indicated, the acquisition of such control information can be performed arbitrarily. It is also possible to arbitrarily perform the acquisition of the control information by changing the target frequency.

When a process of generating the control information in the logic circuit is performed in synchronization with a clock, there are a first embodiment which is synchronous with a clock signal generated based on the control information initially given to the memory circuit, a second embodiment which is synchronous with the external clock signal, and a third embodiment which is synchronous with a clock signal generated in another oscillator circuit which is operated to oscillate in response to the indication of the specified operation mode.

Embodiments of Generation of Control Information

A first embodiment uses a clock counter. Specifically, a sampling circuit (31) for sampling information responsive to the frequency of the internal clock signal and to the frequency of the external clock signal is further provided, wherein the logic circuit (2) makes a frequency comparison between the internal clock signal and the external clock signal by using the information sampled by the sampling circuit and generates control information for causing the frequency of the internal clock signal to coincide with the frequency of the external clock signal. At this time, the logic circuit is, e.g., a CPU (Central Processing Unit) and the memory circuit is a register accessible by the CPU.

A second embodiment uses an internal comparator circuit. Specifically, a comparator circuit (24) for detecting a frequency difference between the internal clock signal and the external clock signal through a comparison made therebetween is further provided, wherein the logic circuit generates control information for causing the frequency of the internal clock signal to coincide with the frequency of the external clock signal by using a result of the comparison by the comparator circuit. At this time, the logic circuit is, e.g., a CPU and the memory circuit is a register accessible by the CPU.

A third embodiment uses an up-down counter. Specifically, the memory circuit is a counter (42) and the logic circuit detects a frequency difference between the internal clock signal and the external clock signal through a comparison made therebetween and up-counts or down-counts the counter by using a result of the comparison.

A fourth embodiment uses the result of an external frequency comparison. The logic circuit receives the result of a frequency comparison between the internal clock signal and the external clock signal from the outside via a latch circuit (32) or the like and generates control information for causing the frequency of the internal clock signal to coincide with the frequency of the external clock signal by referencing the inputted result of the comparison.

Temperature Dependence Compensation Using Constant Current Region

A specific embodiment of the present invention further comprises a D/A converter circuit (21) for performing analog conversion to the control data held in the memory circuit relative to a conversion reference voltage and a bias circuit (22) for forming a bias voltage responsive to an operating power supply voltage which is determined based on an output voltage of the D/A converter circuit. The oscillator circuit is configured as a voltage-control oscillator circuit using a voltage (Vfdd) determined based on the output voltage of the D/A converter circuit as the operating power supply voltage and having the oscillation frequency controlled by the bias voltage. At this time, the bias circuit has a constant current circuit (M7, Rf, M8) comprising MOS transistors each satisfying a condition for a gate-to-source voltage under which a change in drain-to-source current relative to a temperature change is reduced and outputs the drain voltages of the MOS transistors as control voltages. When the operating power supply voltage is changed based on the output voltage of the D/A converter circuit, the constant current circuit can change the bias voltage within the range in which the change in operating power supply voltage satisfies the condition for the gate-to-source voltage and can suppress or reduce the variation due to the temperature change. In this configuration, a frequency variable range is greatly limited in terms of the range in which the condition for the gate-to-source voltage is satisfied. In short, the configuration is limited to applications at a substantially constant frequency.

As a specific embodiment, the constant current circuit comprises the p-channel first MOS transistor (M7) having a source which receives a power supply voltage and a gate and a drain which are short-circuited, the n-channel second MOS transistor (M8) having a source which receives a ground voltage of the circuit and a gate and a drain which are short-circuited, and the resistor element (Rf) having one end coupled to the drain of the first MOS transistor and the other end coupled to the drain of the second MOS transistor and outputs the drain voltages of the first and second MOS transistors as the control voltages.

If consideration is given to the output of the D/A converter circuit which is low in impedance, the output voltage of the D/A converter circuit is preferably supplied as the operating power supply voltage of each of the voltage-control oscillator circuit and the bias circuit via a voltage follower amplifier (47). By inactivating the voltage follower amplifier during standby, it becomes possible to cut off the operating power supply of each of the oscillator circuit and the bias circuit and thereby achieve lower power consumption.

In the case of considering compensation against a power supply variation, it is preferable that a reference voltage generator circuit (45) for generating a reference voltage in which variations in response to variations in power supply voltage and temperature have been compensated for is further provided and that the D/A converter circuit receives the reference voltage as a conversion reference voltage.

Temperature Dependence Compensation Focusing Attention on VLT

In another embodiment of temperature dependence compensation, a D/A converter circuit which performs analog conversion to the control data held in the memory circuit relative to the conversion reference voltage and a bias circuit which forms a bias voltage (VGP, VGN) based on an output voltage of the D/A converter circuit are further provided. The oscillator circuit is configured as a voltage-control oscillator circuit having a ring oscillator portion (51) in the form of a CMOS circuit and having the oscillation frequency controlled by the bias voltage for the current control of the ring oscillator portion. At this time, the bias circuit applies an operating power supply voltage in a direction to suppress a variation in the logic threshold voltage of the CMOS circuit to the oscillator circuit and thereby compensates for a variation in the oscillation frequency of the ring oscillator portion caused by a temperature change.

In a specific embodiment, the voltage-control oscillator circuit has an odd number of CMOS inverter delay stages (50) composing the ring oscillator portion, while the bias circuit has a logic threshold voltage simulator circuit portion (65) which simulates the logic threshold voltage of the CMOS inverter delay stages and changes the operating power supply voltage of the oscillator circuit by using an output of the logic threshold voltage simulator circuit. In the case of considering compensation against a power supply variation, it is preferable that a reference voltage generator circuit for generating a reference voltage in which variations in response to variations in power supply voltage and temperature have been compensated for is further provided and that the D/A converter circuit receives the reference voltage as the conversion reference voltage.

(2) Dynamic Automatic Adjustment of Clock Signal Frequency

A semiconductor integrated circuit in another aspect of the present invention comprises: a memory circuit; an oscillator circuit for generating an internal clock signal based on control information held in the memory circuit; and a logic circuit (70) for counting the internal clock signal for each fixed interval of a pulse periodically generated and updating the control information in a direction to cause a count value to an expected value, wherein the internal clock signal is used for a synchronous operation of an internal circuit. The expected value of the count value is correlated to a target frequency. This allows the frequency of the internal clock signal to be adjusted dynamically and automatically by using the fixed interval of the pulse periodically generated as a reference based on the expected value in accordance with the target frequency. Since the oscillation frequency of the oscillator circuit is adjusted dynamically in each cycle of the pulse, it suffices in principle if there is no temperature dependence and no power-supply-voltage dependence for the fixed interval.

In a specific embodiment of the present invention, an interval generator circuit (71) for periodically generating the fixed interval of the pulse is provided. The interval generator circuit has a pulse generator circuit (72), a CR time constant circuit (73) for performing either a charging operation or a discharging operation from a specified phase point in the pulse generated from the pulse generator circuit, and a detector circuit (74) for detecting the reaching of a prescribed voltage by a voltage obtained in the CR time constant circuit. It is assumed that fixed interval spans from the specified phase point to the timing of detection by the detector circuit. The temperature dependence of the CR time constant circuit is as small as can be substantially ignored.

Preferably, the prescribed voltage is formed based on a reference voltage generated in the reference voltage generator circuit and the reference voltage is a voltage in which variations in response to variations in power supply voltage and temperature have been compensated for. Power-supply-voltage dependence is no more observed for the fixed interval. There should be no substantial problem if the oscillator circuit has power-supply-voltage dependence and temperature dependence.

In a specific embodiment of the present invention, the memory circuit is, e.g., an up-down counter (42). The up-down counter performs up-counting or down-counting in synchronization with the pulse generated from the pulse generator circuit.

In a specific embodiment of the present invention, a D/A converter circuit for performing analog conversion to the control data held in the memory circuit relative to the conversion reference voltage and the bias circuit for forming the bias voltage which is changed in response to an output voltage of the D/A converter circuit are further provided. The oscillator circuit is a voltage-control oscillator circuit having the oscillation frequency controlled by the bias voltage. If consideration is given to power-supply-dependence compensation of the D/A converter circuit, it is appropriate for the D/A converter circuit to receive the reference voltage generated in the reference voltage generator circuit as the conversion reference voltage.

In a specific embodiment of the present invention, a nonvolatile memory device is further provided. The nonvolatile memory device has the control information which is initially loaded into the memory circuit in response to such power-on reset as to indicate an initializing operation for the semiconductor integrated circuit and the expected value which is loaded into the logic circuit. It is appropriate to preliminarily store the control information and the expected value in a nonvolatile memory on shipping the semiconductor integrated circuit. If the nonvolatile memory is electrically rewritable, the user is allowed to arbitrarily select an oscillation frequency by rewriting at least the expected value.

(3) Frequency Divider Circuit

A frequency divider circuit for dividing the frequency of the clock signal outputted from the oscillator circuit may also be provided. The frequency divider circuit is preferably a variable frequency divider circuit. On shipping the semiconductor integrated circuit, the control information is stored in the nonvolatile memory such that an internal oscillation frequency matches a maximum operating frequency. The user may appropriately select an arbitrary frequency by using the variable frequency divider.

The following is the brief description of effects achievable by the representative aspects of the invention disclosed in the present application.

That is, internal oscillation can be performed with high precision in a semiconductor integrated circuit.

BRIEF DESCRIPTION OF THE DRAWINGS

FIG. 7E is a view illustrating an embodiment of the control of the unit information cell;

DESCRIPTION OF THE PREFERRED EMBODIMENTS

Microcomputer

Figure 1:
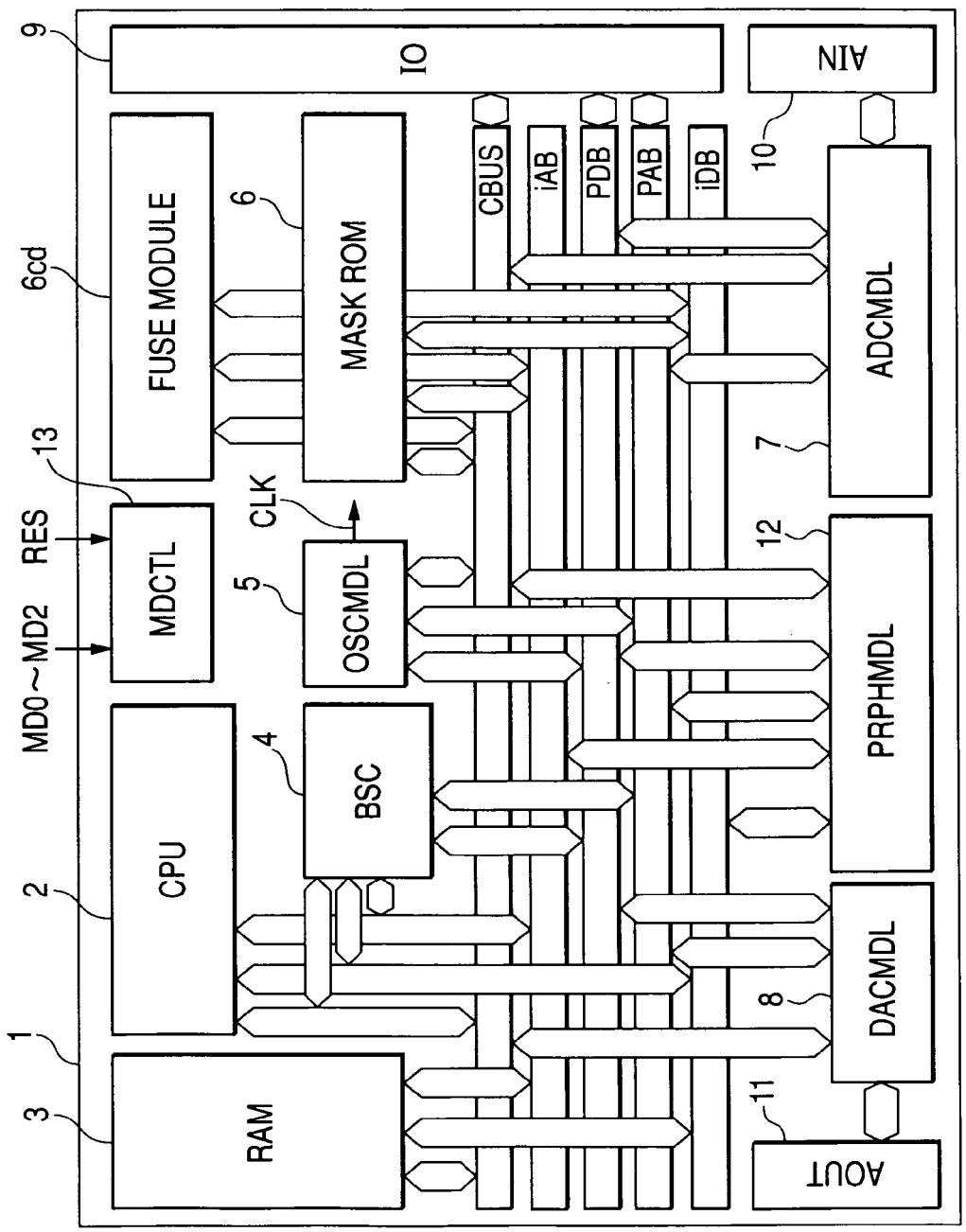
FIG. 1 is a block diagram illustrating a microcomputer according to an embodiment of the present invention.

FIG. 1 illustrates a microcomputer according to an embodiment of the present invention. The microcomputer 1 shown in the drawing is formed on a single semiconductor substrate (semiconductor chip) made of a material such as a single-crystal silicon by using, e.g., a technology for manufacturing a CMOS integrated circuit.

The microcomputer 1 has: a control signal bus CBUS; an internal address bus iAB; an internal data bus iDB; a peripheral address bus PAB; and a peripheral data bus PDB to each of which a specified circuit module is coupled, though these buses are not particularly limited. As the circuit module mentioned above, the microcomputer has: a central processing unit (CPU) 2; a random access memory (RAM) 3 used as the work region of the CPU 2 or the like; a bus state controller (BSC) 4; an internal oscillator circuit module (OSCMDL) 5; a mask ROM (Read Only Memory) 6; a fuse module 6cd; an analog-to-digital conversion module (ADC-MDL) 7; a digital-to-analog conversion module (DAC-MDL) 8; a versatile input/output port (IO) 9; an analog input circuit (AIN) 10 connected to the ADC 7; an analog output circuit (AOUT) 11 connected to the DAC 8; a mode control circuit (MDCTL) 13; and an other peripheral circuit module (PRPHMDL) 12.

The CPU 2 has an instruction controller for fetching an instruction, interpreting the fetched instruction, and generating a control signal and an executor for executing an arithmetic operation process or the like by using operands in response to the control signal. The mask ROM 6 holds control data, a control program for the CPU 2, and the like. In this embodiment, the fuse module 6cd comprises nonvolatile memory cells formed by a CMOS process and an electric fuse circuit capable of storing control information generated in a logic circuit. The OSCMDL 5 generates a clock signal CLK by conducting internal oscillation without necessitating an externally mounted oscillator. The clock signal CLK is used as an operational reference clock signal when the internal circuit module is operated in synchronization with the clock or the like. Although the one clock signal CLK is depicted herein as a representative, several types of clock signals at different frequencies are actually generated and supplied to the corresponding circuit module in correspondence to the case where circuit modules at different operating speeds are contained or to the case where the operating speed is varied in accordance with an operation mode. To the MDCTL 13, mode signals MD0 to MD2 and a reset signal RES are supplied. In the microcomputer 1, when reset is indicated by the reset signal RES or the like, an on-chip circuit module such as the CPU 2 is initialized. When the reset indication by the reset signal RES is cancelled, the CPU 2 reads an instruction from a specified start address and starts the execution of a program. The start address is determined based on the operation mode indicated by the mode signals MD0 to MD2 and the like.

Figure 2:
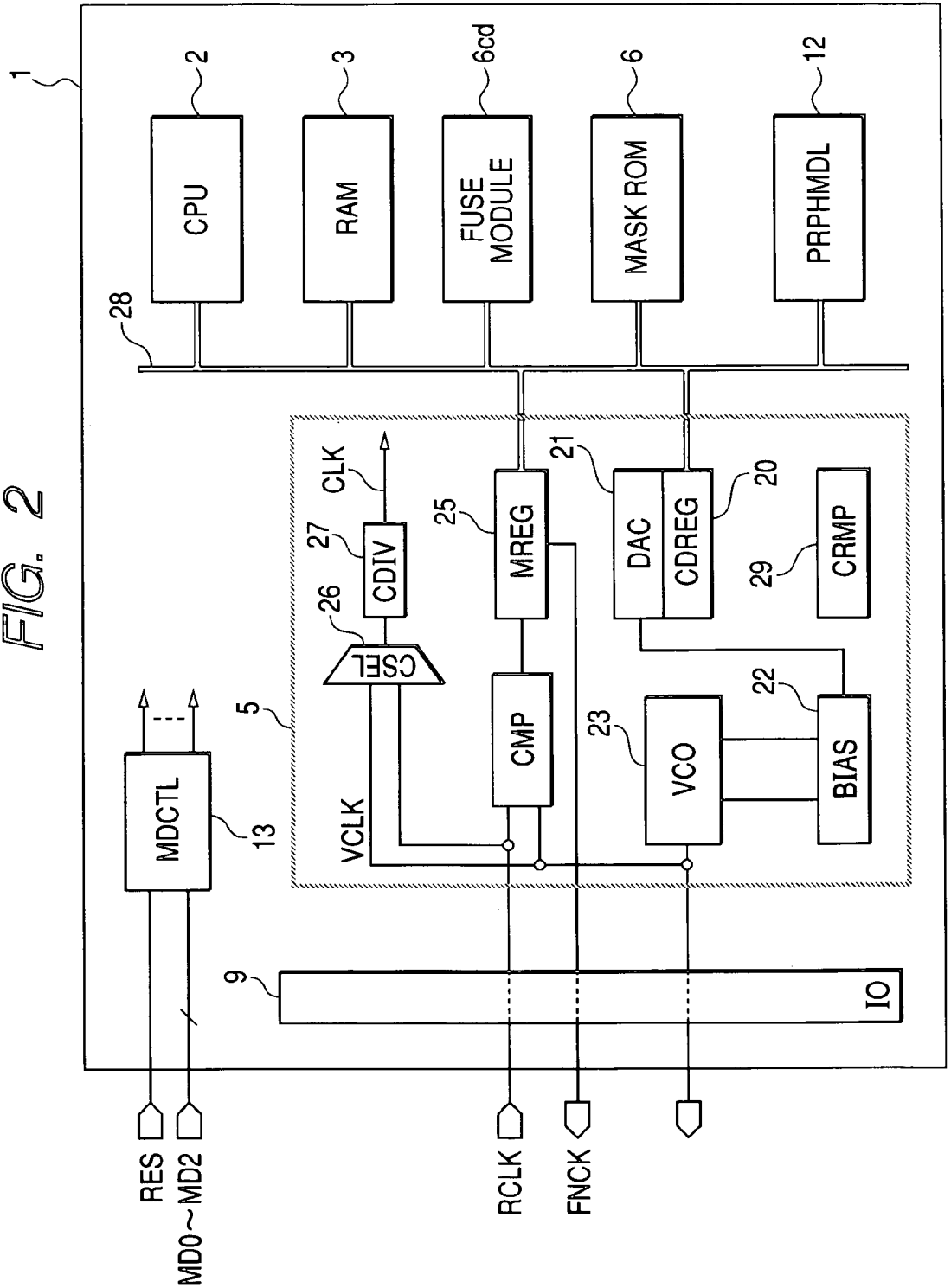
FIG. 2 is a block diagram showing a first example of an internal oscillator circuit module.

FIG. 2 shows a first example of the internal oscillator circuit module 5. The internal oscillator circuit module 5 has: a control data register (CDREG) 20 as a memory circuit; a digital-to-analog converter circuit (DAC) 21 for performing digital-to-analog conversion to control information loaded in the CDREG 20; a bias circuit (BIAS) 22 which receives an output of the D/A converter circuit 21 and forms a control voltage; a voltage-control oscillator circuit (VCO) 23 which conducts oscillation at a frequency in accordance with the control voltage; a comparator circuit (CMP) 24 capable of comparing the frequency of the internal clock signal VCLK generated in the voltage-control oscillator circuit 23 with the frequency of an external clock signal RCLK; a monitor register (MREG) 25 for holding the result of a comparison by the comparator circuit 24; a clamp power supply circuit (CRMP) 29 used for setting a conversion reference voltage for D/A conversion; a selector (CSEL) 26 for selecting the internal clock signal or the external clock signal; and a frequency divider circuit (CDIV) 27 for dividing the frequency of an output of the selector 26. Each of the control data register 20 and the monitor register 25 is disposed in an address space in the CPU 2 to be made accessible via the internal bus 28. The internal bus 28 is a general term for the control signal bus CBUS, the internal address bus iAB, the internal data bus iDB, the peripheral address bus PAB, and the peripheral data bus PDB, each mentioned above. Clock selection by the clock selector 26 is controlled by the mode control circuit 13. The ratio of frequency division by the frequency divider circuit 27 is set to an initial value by a resetting operation and then made variable through the execution of an instruction by the CPU 2. The foregoing monitor register 25 is also used as a register for outputting a clock fetch signal FNC for reporting the end of a frequency setting operation in accordance with a frequency setting mode to the outside. An input terminal for the external clock signal RCLK, an output terminal for the clock fetch signal FNCK, and an output terminal for the internal clock signal VCLK may be either dedicated terminals or shared terminals.

The mode control circuit (MDCTL) 13 loads the control information from the fuse module 6cd into the control data register 20 upon an initializing operation (power-on reset). When the operation mode indicated by the mode signals MD0 to MD2 is the frequency setting mode, the selector 26 selects the external clock signal RCLK upon reset cancellation, while the CPU 2 executes a frequency setting program in synchronization with a clock signal CLK based on the external clock signal RCLK. A control voltage is formed based on a DA conversion output outputted from the DAC 21 based on the control information initially set to the CDREG 20, whereby the oscillation frequency of the VCO 23 is determined. The CPU 2 periodically references the monitor register 25 and judges whether or not the result of the comparison by the frequency comparator circuit 24 is a coincidence. In the case of no coincidence, the CPU 2 accesses the control data register 20 and updates the control information in a direction to cause the frequency of the internal clock signal to coincide with the frequency of the external clock signal. When the result of the judgment is a coincidence, the CPU 2 stores the control information of the control data register 20 in the fuse module 6cd and ends the execution of the frequency setting program. Upon ending the execution of the frequency setting program, the CPU 2 outputs a clock fetch end signal FNCK to the outside via the MREG 25. Upon receipt of the clock fetch end signal FNCK, the generation of the clock signal RCLK or the like is halted outside.

When the operation mode indicated by the mode signals MD0 to MD2 is a normal mode, the selector 26 selects the internal clock signal upon reset cancellation. The control information acquired in the frequency setting mode and stored in the fuse module 6cd has already been initially loaded in the control data register 20 upon power-on reset so that, upon reset cancellation, the VCO 23 is capable of performing an oscillating operation based on the control information acquired in the frequency setting mode and the microcomputer 1 is enabled to perform data processing in synchronization with the clock signal CLK defined by the internal clock signal VCLK. Since the control information stored in the fuse module 6cd is thus loaded into the control data register 20 to be reused, the internal clock signal VCLK at the same target frequency as the external clock signal RCLK can constantly be generated by using only the internal oscillator circuit module 5. In other words, even when an error occurs in the oscillation characteristic of the VCO 23 due to a process variation, the VCO 23 is allowed to perform an oscillating operation at the target frequency without necessitating the mounting of an external crystal oscillator or the inputting of the external clock signal. This allows the compensation of a variation in oscillation characteristic (a variation in oscillation frequency) due to the process variation.

When the operation mode indicated by the mode signals MD0 to MD2 upon reset cancellation is a first test mode, the selector 26 selects the external clock signal. When the indicated operation mode is a second test mode, the selector 26 selects the internal clock signal.

Figure 15:
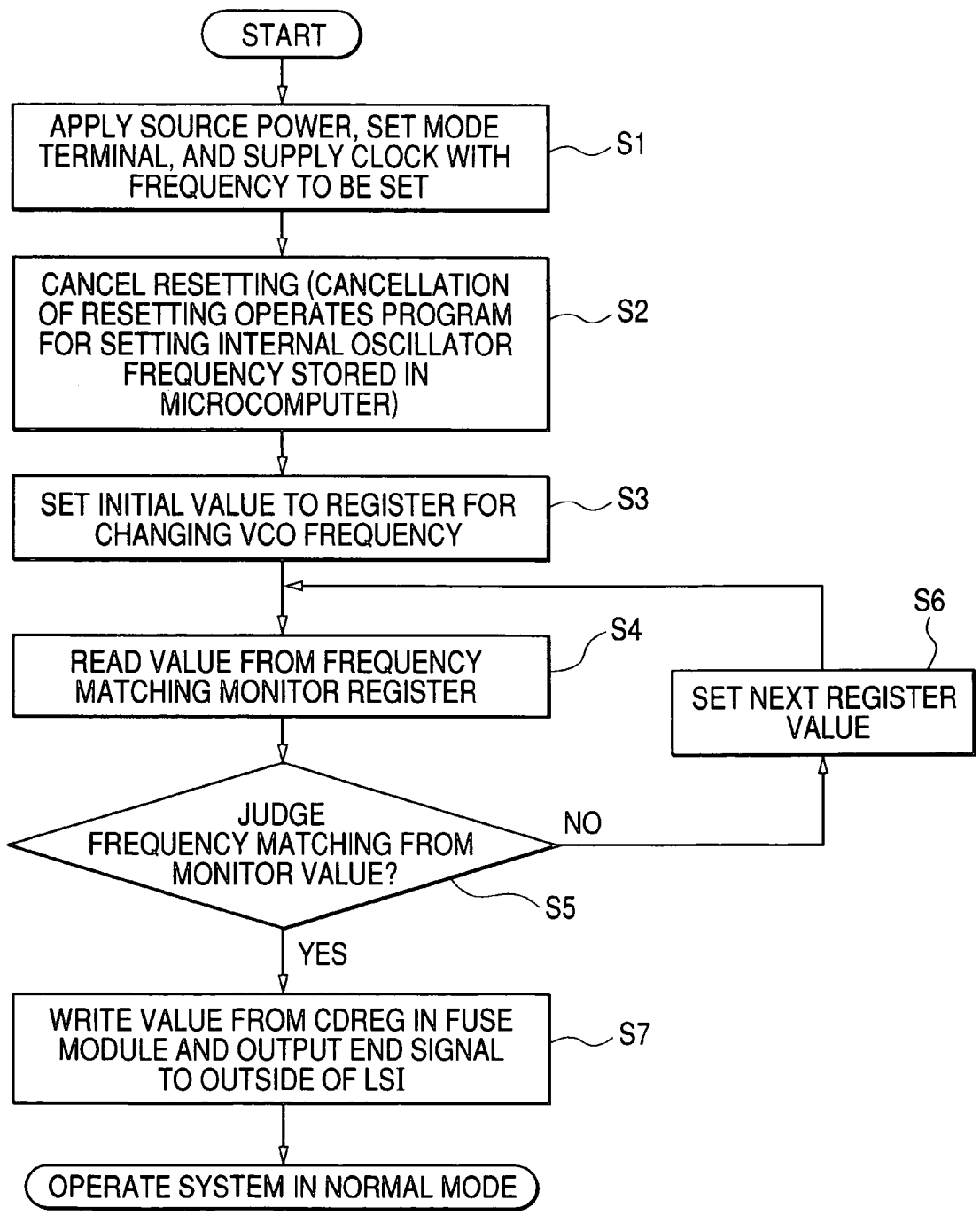
FIG. 15 is a flow chart illustrating an internal-oscillation-frequency setting operation illustrated in FIG. 2.

FIG. 15 illustrates a flow chart for the internal-oscillation-frequency setting operation described above. Through the application of power, the inputting of the mode signals MD0 to MD2, and the inputting of the external clock signal RCLK, the power-on reset of the microcomputer 1 (S1) is performed. Upon reset cancellation, the CPU 2 starts the execution of the frequency setting program based on the states of the mode signals MD0 to MD2 indicative of the frequency setting mode (S2). The CPU 2 sets the initial value of the control information to the CDREG 20 in accordance with the frequency setting program (S3). Then, the CPU 2 reads the value from the MREG 25 (S4), judges whether or not the frequency of the internal clock signal has coincided with the frequency of the external clock signal (S5), and sets the next control information to the CDREG 20 in the event of no coincidence (S6). If a coincidence is detected, the CPU 2 stores the control information of the CDREG 20 in the fuse module 6cd and reports the end of the processing to the outside (S7). Thereafter, the microcomputer 1 becomes operable in the normal mode (user mode) or the like through reset.

Figure 3:
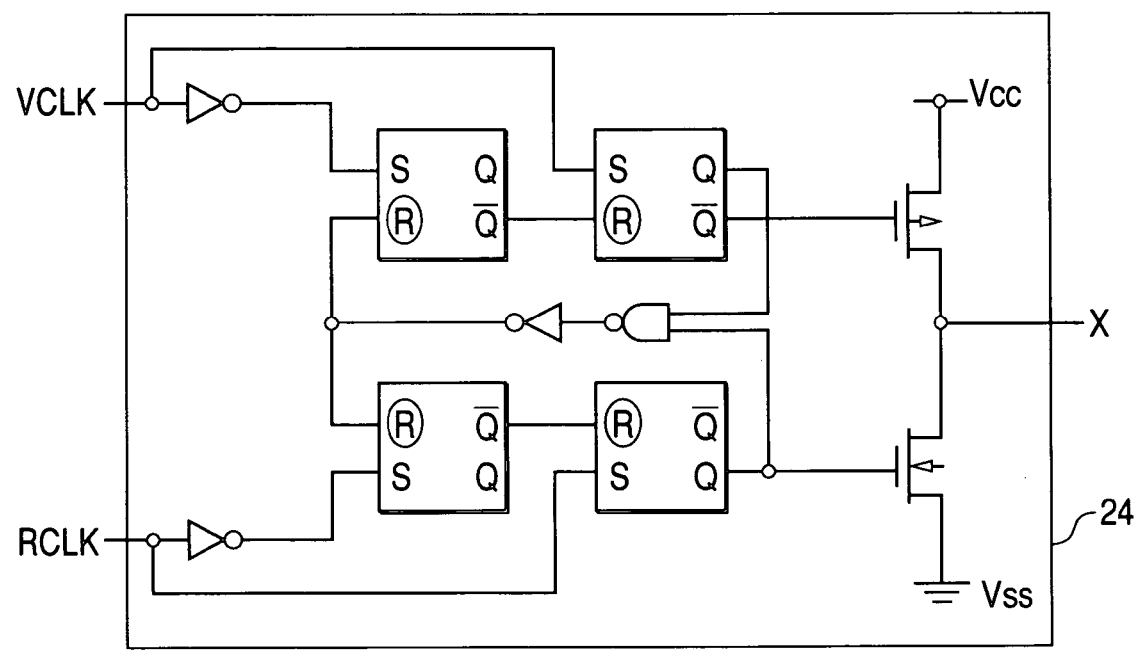
FIG. 3 is a logic circuit diagram showing an example of a comparator circuit.

FIG. 3 shows an example of the comparator circuit 24. The comparator circuit 24 shown herein attempts to detect a frequency difference through phase comparison. Specifically, the comparator circuit 24 detects the phase difference between the internal clock signal VCLK and the external clock signal RCLK by using four RS flip-flops of a reset preferential type. When the phase of the internal clock signal VCLK is leading that of the external clock signal RCLK, the output X of the comparator circuit 24 is brought to the HIGH level (logic value "1"). When the phase of the internal clock signal VCLK is lagging behind that of the external clock signal RCLK, the output X of the comparator circuit 24 is brought to the LOW level (logic value "0"). Otherwise, the output X of the comparator circuit 24 is brought into a high-impedance state. The monitor register 25 periodically latches the result of the phase comparison with a specified timing. The comparator circuit 24 may also be configured by using a clock counter and a magnitude comparator, though they are not particularly depicted. Specifically, a first counter which receives the internal clock signal VCLK at a clock terminal and a second counter which receives the external clock signal RCLK at a clock terminal are provided. To both of the counters, the clearing of the counters, count start indications, count halt indications, the outputting of count values, and a magnitude comparison between the outputted count values using the magnitude comparator may be performed in parallel such that the result of the comparison is held appropriately in the monitor register 25.

Figure 6:
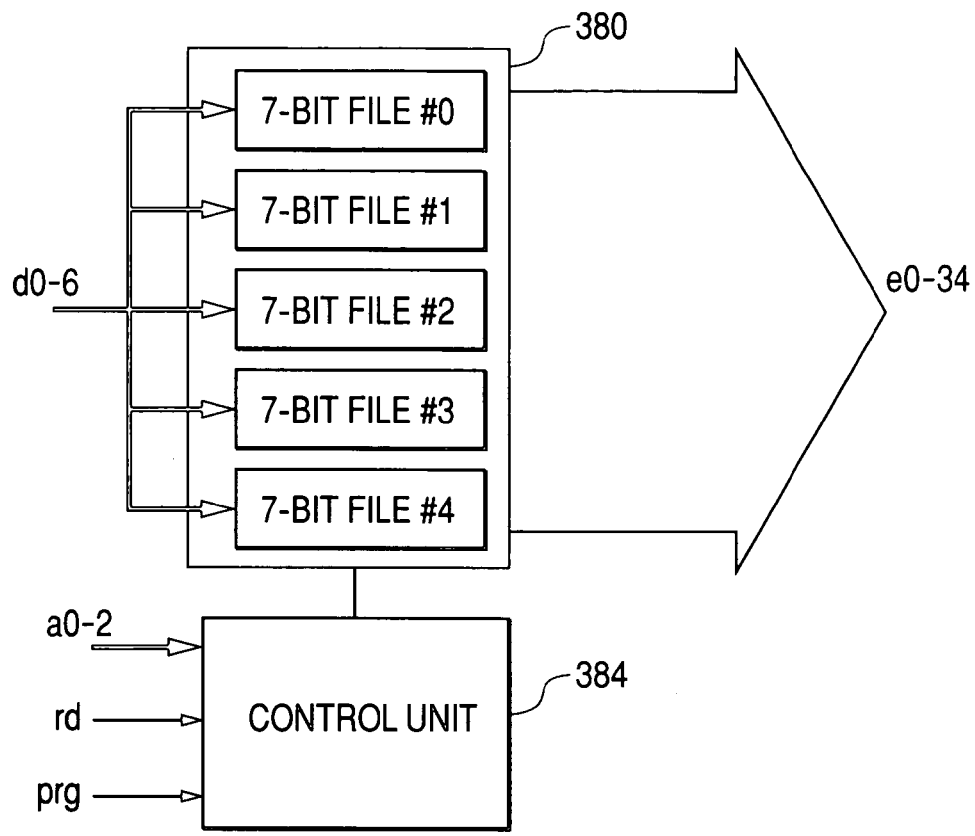
FIG. 6 is a block diagram of an example of the configuration of a fuse module contained in the microcomputer mentioned above.

FIG. 6 shows an example of the configuration of the fuse module 6cd.

The fuse module 6cd shown in the drawing is assumed to be an electric fuse circuit comprising: a nonvolatile memory 380 having five nonvolatile memory blocks (7bFile#0 to 7bFile#4) as a group of nonvolatile information memory cells; and a control circuit 384. Data sets to be written in the nonvolatile memory 380 are given as d0 to d6 from the outside. To the controller 384, address signals a0 to a2 for selecting among the nonvolatile memory blocks 7bFile#0 to 7bFile#4, a read operation indication signal rd, and a write operation indication signal prg are inputted.

Figure 7A:
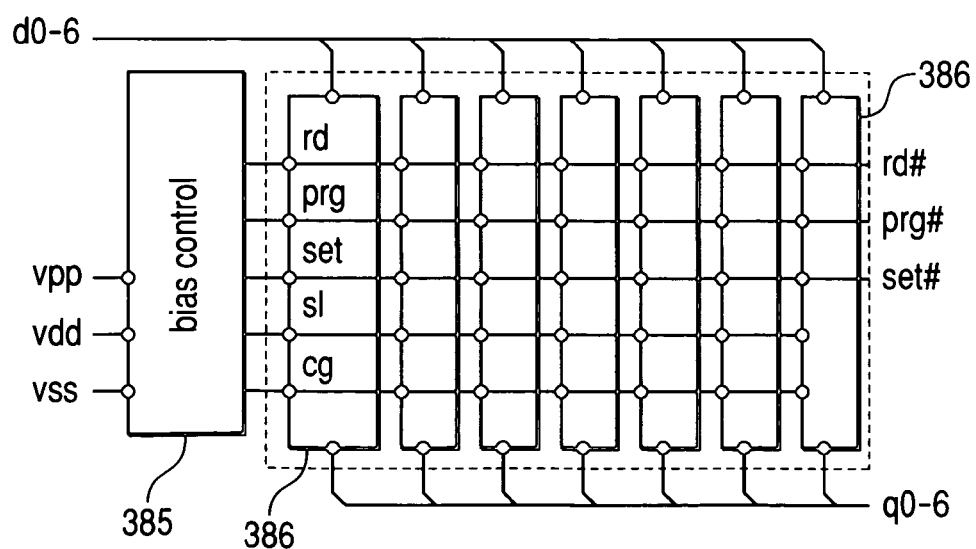
FIG. 7A is a view illustrating an example of the configuration of nonvolatile memory blocks.

FIG. 7A shows a circuit example of the nonvolatile memory blocks 7bFile#0 to 7bFile#4. Each of the nonvolatile memory blocks has unit information cells 386 which are equally configured to correspond to 7 bits. The control of the unit information cells 386 is performed by a bias controller 385. The bias controller 385 outputs control signals rd, prg, set, s1, and cg to the unit information cells 385 based on indications from the control circuit 384.

Figure 7B:
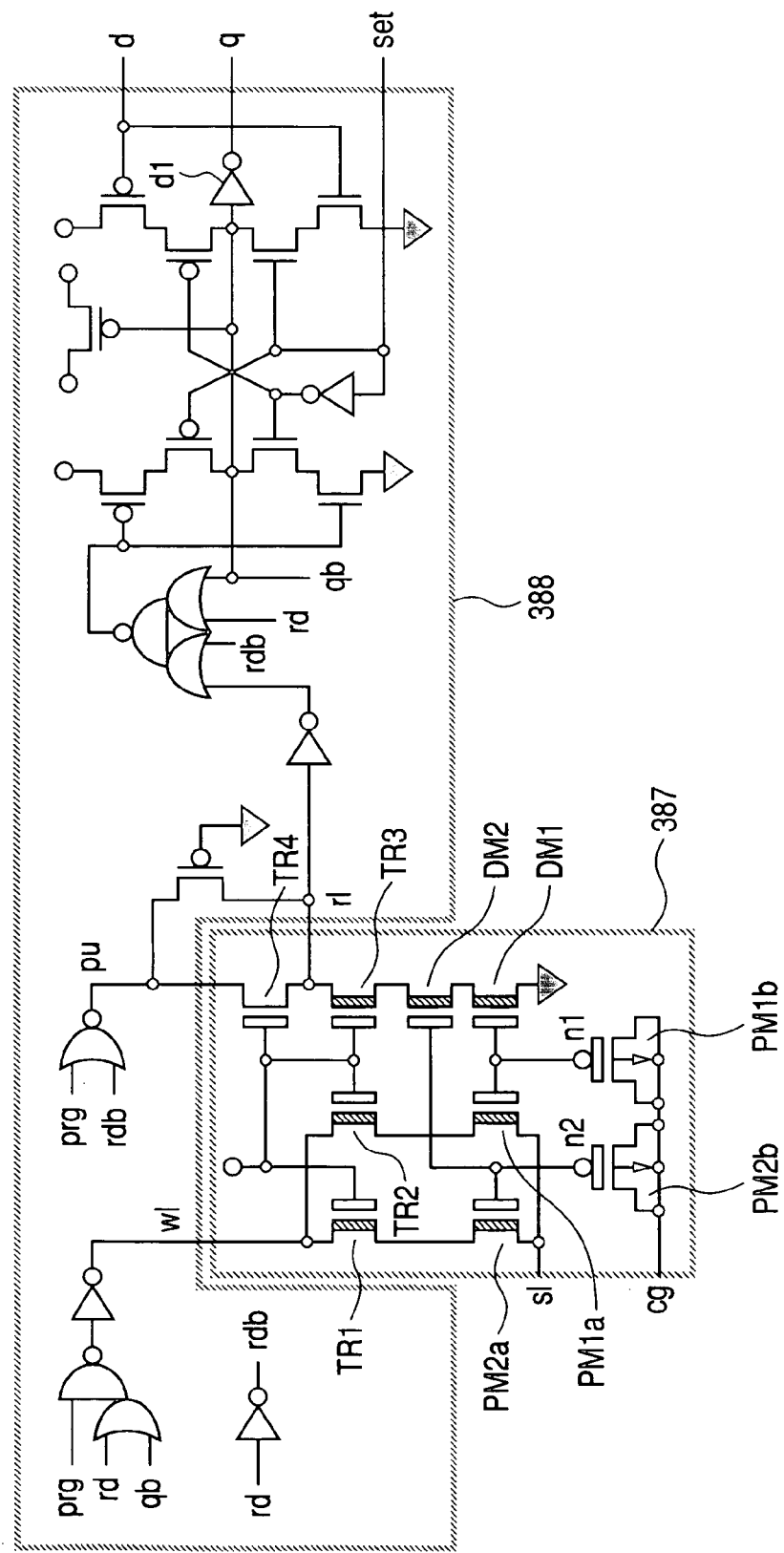
FIG. 7B is a circuit diagram of an example of the configuration of each of unit information cells contained in each of the nonvolatile memory blocks mentioned above.

FIG. 7B shows an example of each of the unit information cells 386. The unit information cell 386 is composed of a memory cell portion 387 and a write/read control circuit 388.

The memory cell portion 387 has a nonvolatile memory element PM1 composed of a MIS capacitor element PM1b and a MIS transistor PM1a and a nonvolatile memory element PM2 composed of a MIS capacitor element PM2b and a MIS transistor PM2a, though these elements are not particularly limited.

Figure 7C:
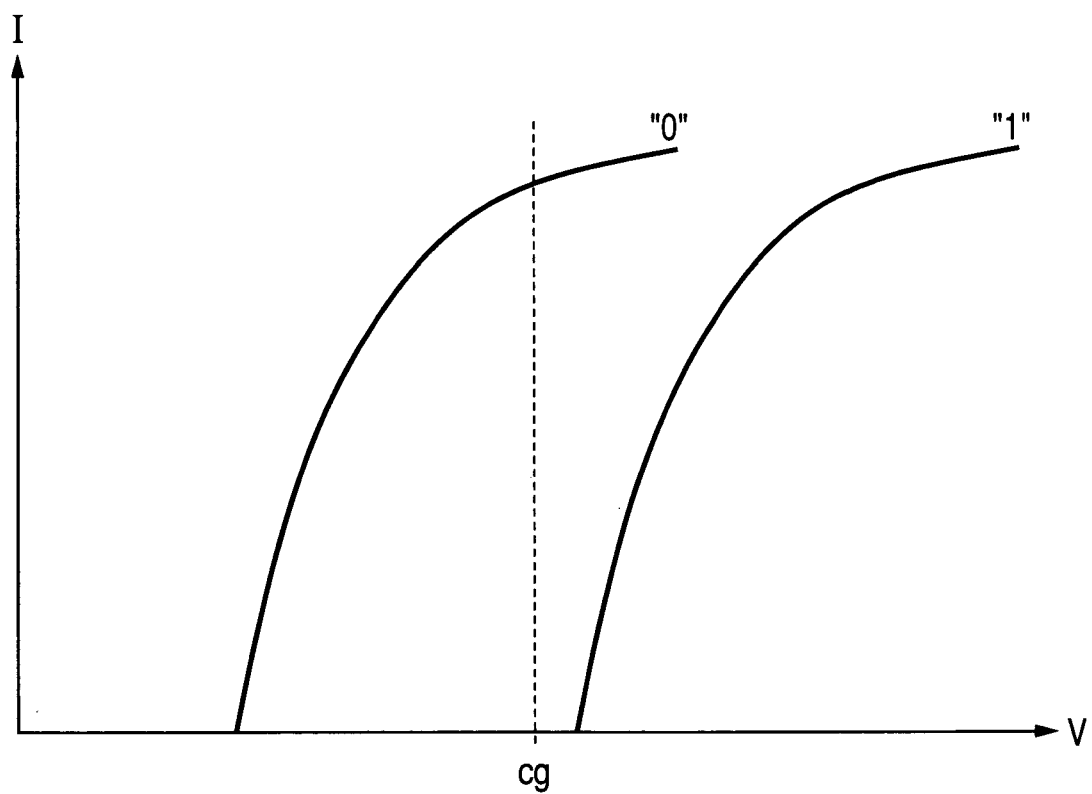
FIG. 7C is a characteristic view of a read MIS transistor.

Each of read MIS transistors DM1 and DM2 is composed of an enhancement type. The voltage-current characteristic of each of the MIS transistors DM1 and DM2 is as illustrated in FIG. 7C. The voltage-current characteristic relative to the control gate voltage cg differs depending on the written state and erased state of the corresponding nonvolatile memory element. In the drawing, "1" indicates that the nonvolatile memory element is in the written state and "0" indicates that the nonvolatile memory element is in the erased state.

The drain of the read MIS transistor DM2 is coupled to a control node pu via n-channel MIS transistors TR3 and TR4 and the potential at the coupling node between the transistors TR3 and TR4 is given as an output r1 to the write/read control circuit 388. The MIS transistors PM1a and PM2a are coupled to a control node w1 via n-channel MIS transistors TR1 and TR2, respectively. The gate electrode of each of the transistors TR1 to TR4 is biased with a power supply voltage. The cg corresponds to a control gate and the s1 corresponds to a source line.

Figure 7D:
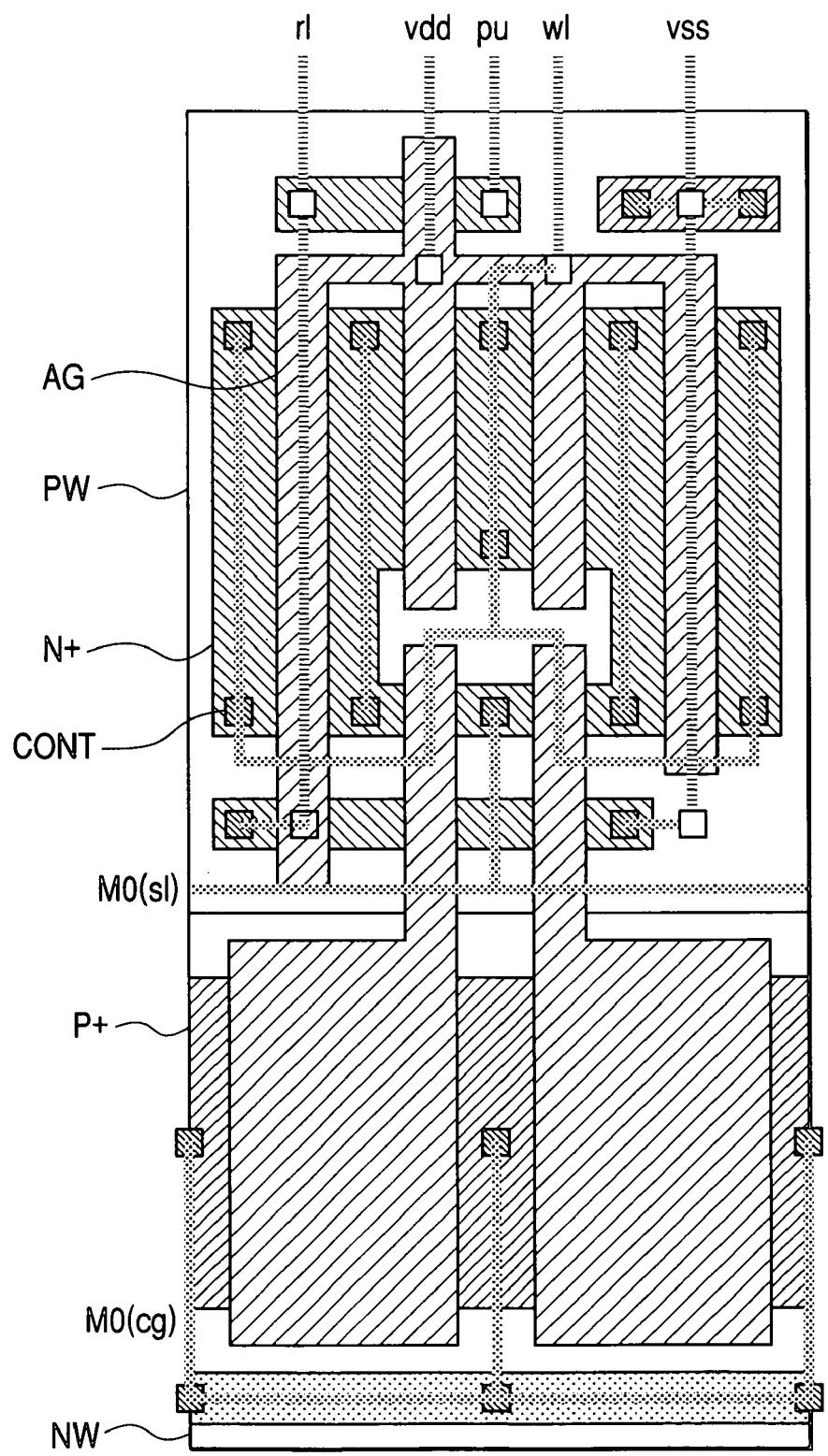
FIG. 7D is a view illustrating the layout of a memory cell portion in the unit information cell mentioned above.

FIG. 7D illustrates the layout pattern of the memory cell portion 387. In the drawing, the memory cell portion 387 is formed in a p-type well region PW and in an n-type well region NW. It is assumed that N+ indicates each of n-type diffusion regions formed in the p-type well region PW to serve as the source and drain electrodes of the n-channel MIS transistor. AG is the gate electrode of each of TR1, TR2, and the like, while CONT is a contact hole. P+ is a diffusion layer formed in the n-type well region NW to serve as a control gate composed of PM1b and PM2b.

Figure 7F:
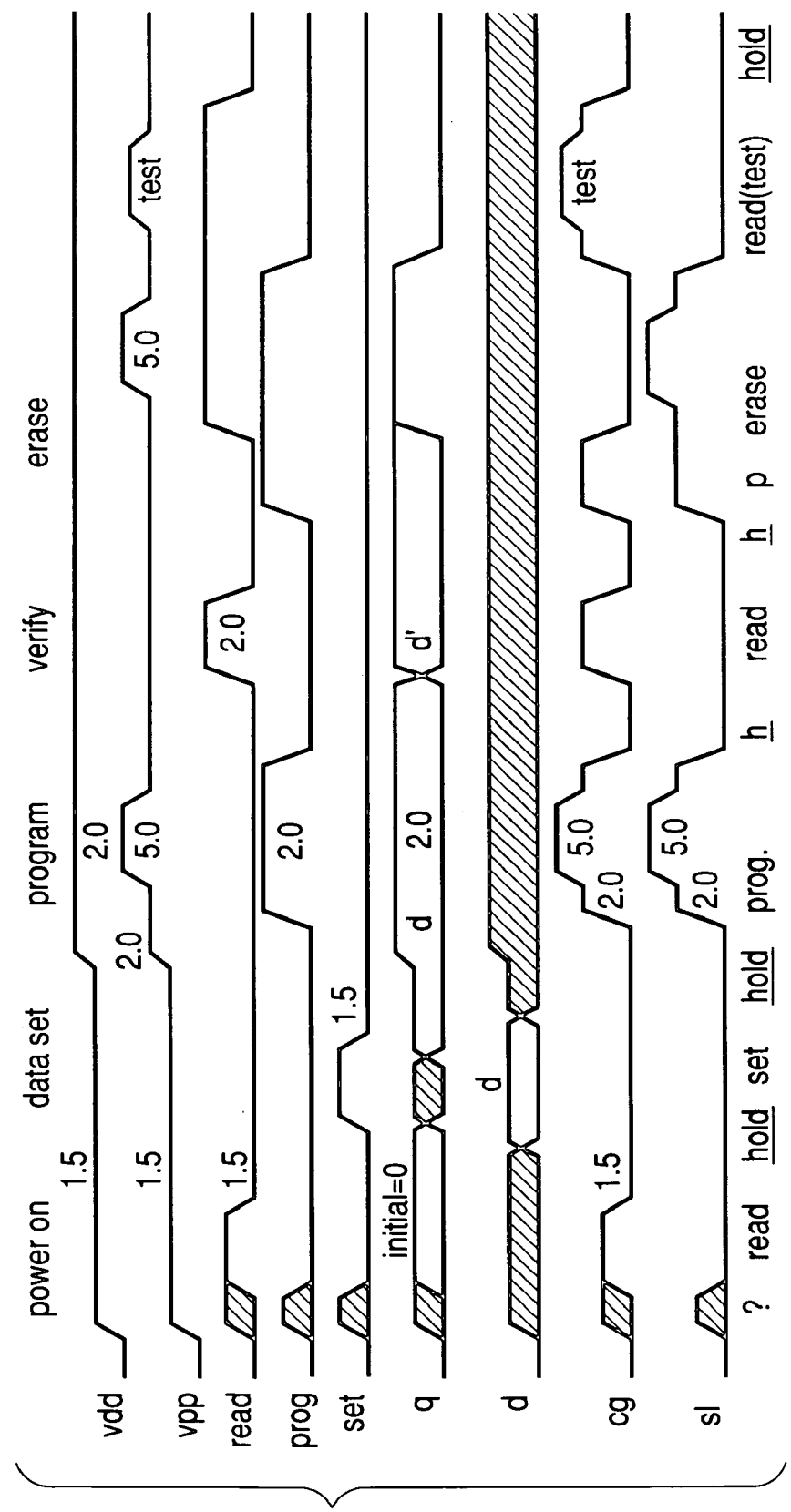
FIG. 7F is a timing chart for a programming operation performed with respect to the unit information cell mentioned above.
Figure 7G:
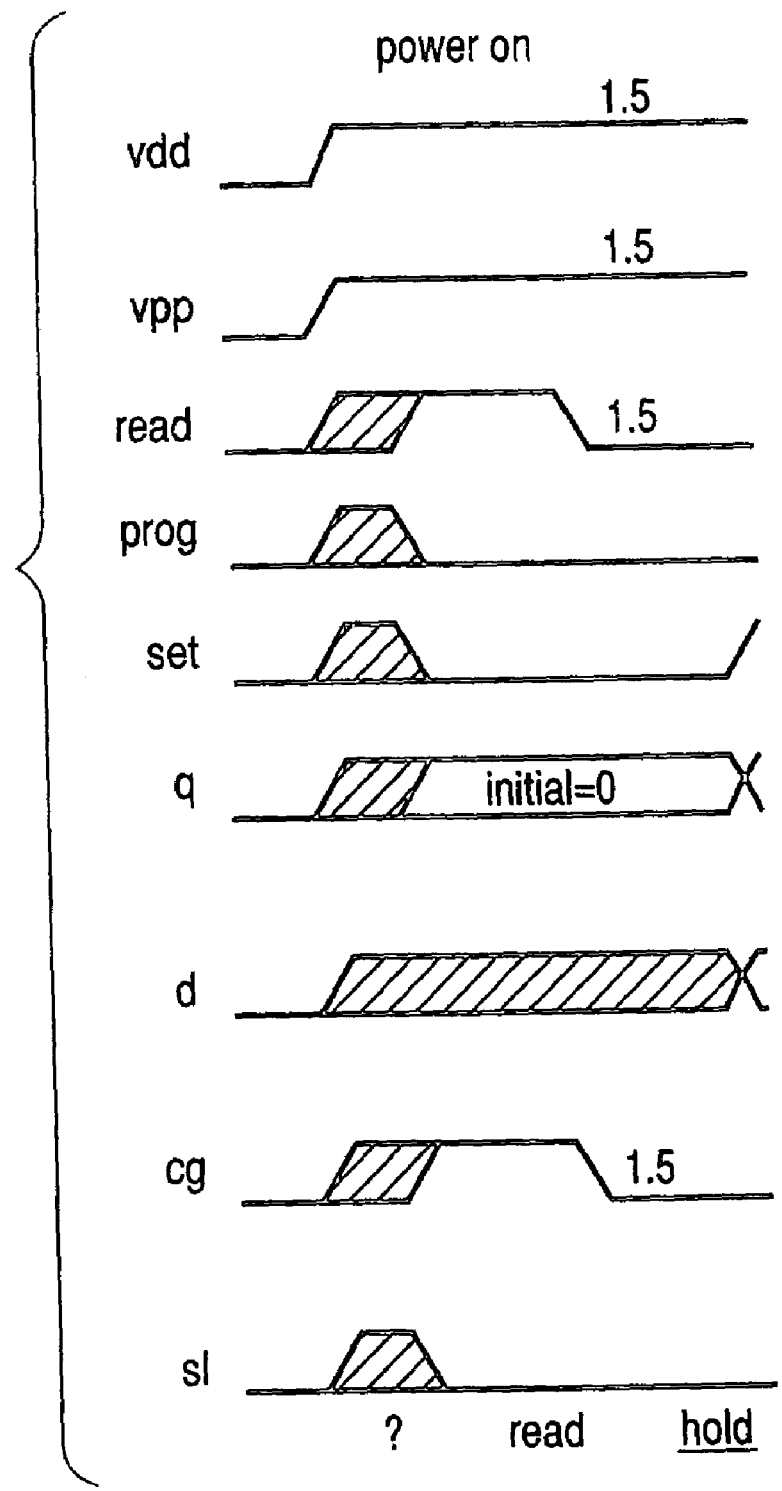
FIG. 7G is a read-out timing chart when the fuse module mentioned above is in practical use.

FIG. 7E illustrates an embodiment of the control of each of the unit information cells 386 by the bias controller 385. FIG. 7F shows an example of a timing chart for a programming operation performed with respect to the unit information cell 386 according to the embodiment of the control. FIG. 7G shows a read-out timing chart when the fuse module is in practical use after the completion of the program performed with respect to the unit information cell 386.

The following is the outline of the operation shown in the drawings. During a data write operation, the nonvolatile memory elements PM1 and PM2 are turned ON by applying 5 V to each of the terminals s1 and cg and 0 V to the terminal w1 and hot electrons are injected into a floating gate from the terminal s1. During an erase operation, 5 V is applied only to the terminal s1 so that electrons are emitted by tunneling from the floating gate. During a read operation, 1.5V is applied to each of the terminals pu and cg so that a potential at the terminal r1 determined by the switched state or transconductance state in each of the transistors DM1 and DM2 responsive to charge accumulated over the floating gate is latched by a subsequent-stage latch circuit. During the read operation, each of the source electrode (s1) and drain electrode (w1) of each of the nonvolatile memory elements PM1a and PM2a is fixed to 0 V. This prevents a situation in which weak hot electrons are injected from the transistors PM1a and PM2a into the floating gate. At that time, the injection of hot electrons from the read MIS transistors DM1 and DM2 into the floating gate is apt to occur but, since the TR4, TR3, DM2 and DM1 are vertically stacked, the drain voltage of each of the read MIS transistors DM1 and DM2 reaches a level not more than the level at the pu and the injection of such hot electrons is presumably as small as can be substantially ignored because the controlled level at the cg during the read operation is also low. As a result, the read failure rate of each of the nonvolatile memory elements PM1 and PM2 is lowered.

Figure 4:
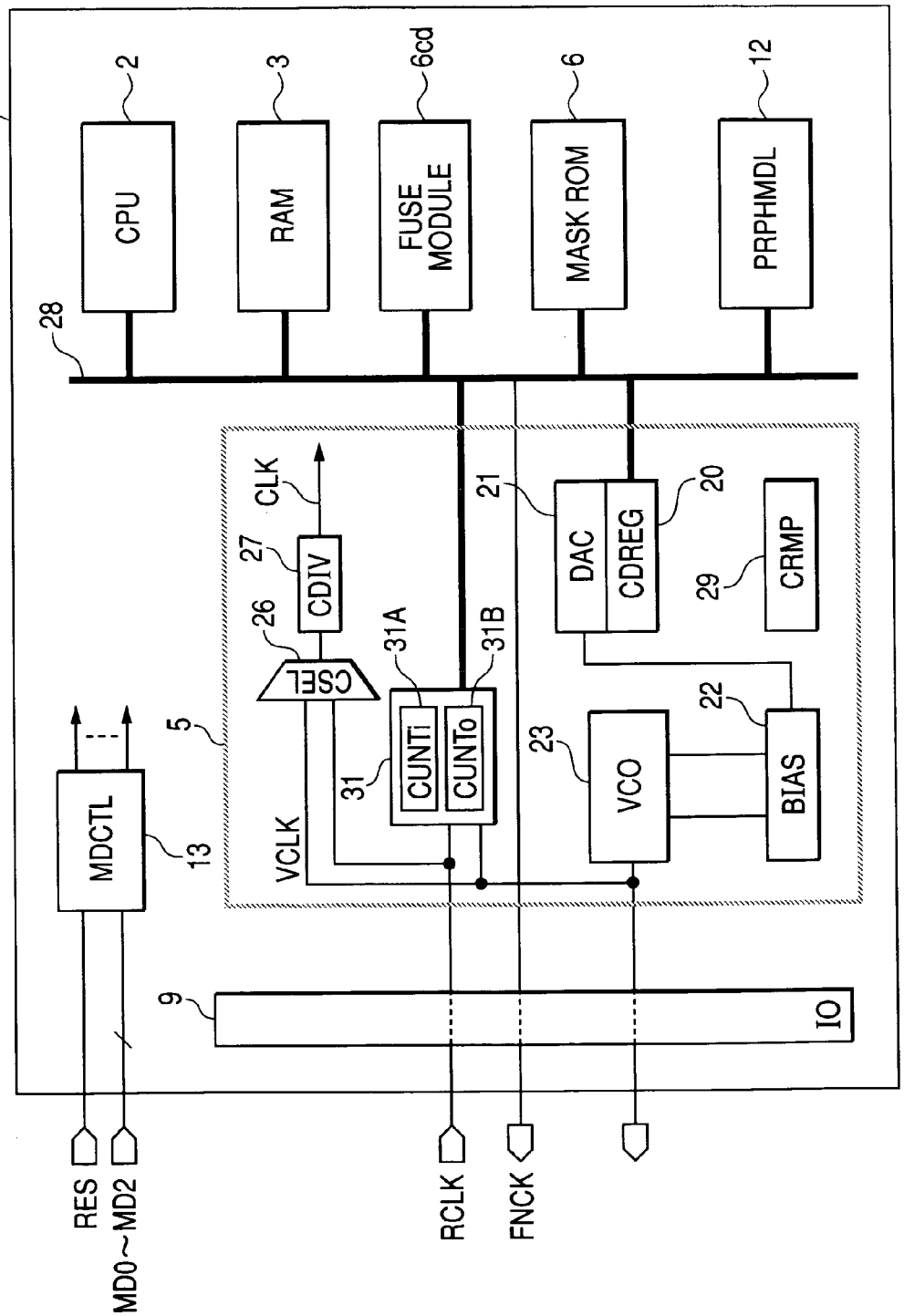
FIG. 4 is a block diagram showing a second example of the internal oscillator circuit module.

FIG. 4 shows a second example of the internal oscillator circuit module 5. In this example, a sampling circuit 31 is provided in place of the CMP 24 and the MREG 25 of FIG. 2. The sampling circuit 31 has: a first counter (CUNTi) 31A which receives the internal clock signal VCLK at a clock terminal and a second counter (CUNTo) 31B which receives the external clock signal RCLK at a clock terminal. At this time, the CPU 2 periodically performs the operations of cleaning the first and second counters 31A and 31B, giving thereto count start indications, giving thereto count end indications, reading count values therefrom, and making a comparison between the read values instead of the read operation which is performed periodically with respect to the monitor register 25 in response to the frequency setting mode. The operation of responding to the result of the comparison is the same as shown in FIG. 2 so that the detailed description thereof will be omitted. The same effects as shown in FIG. 2 are achievable, though a processing burden on the CPU 2 is slightly increased. The configuration of the sampling circuit 31 which uses the clock counters may also be replaced with a configuration which performs a phase comparison between the internal clock signal and the external clock signal and holds the result of the comparison in the latch circuit such that it is accessible by the CPU 2. At this time, the circuit of FIG. 3 and the like may be used appropriately for the phase comparison. Even in the case of using the internal oscillator circuit module 5 of FIG. 4, the flow of the internal-oscillation-frequency setting operation is the same as shown in FIG. 15.

Figure 5:
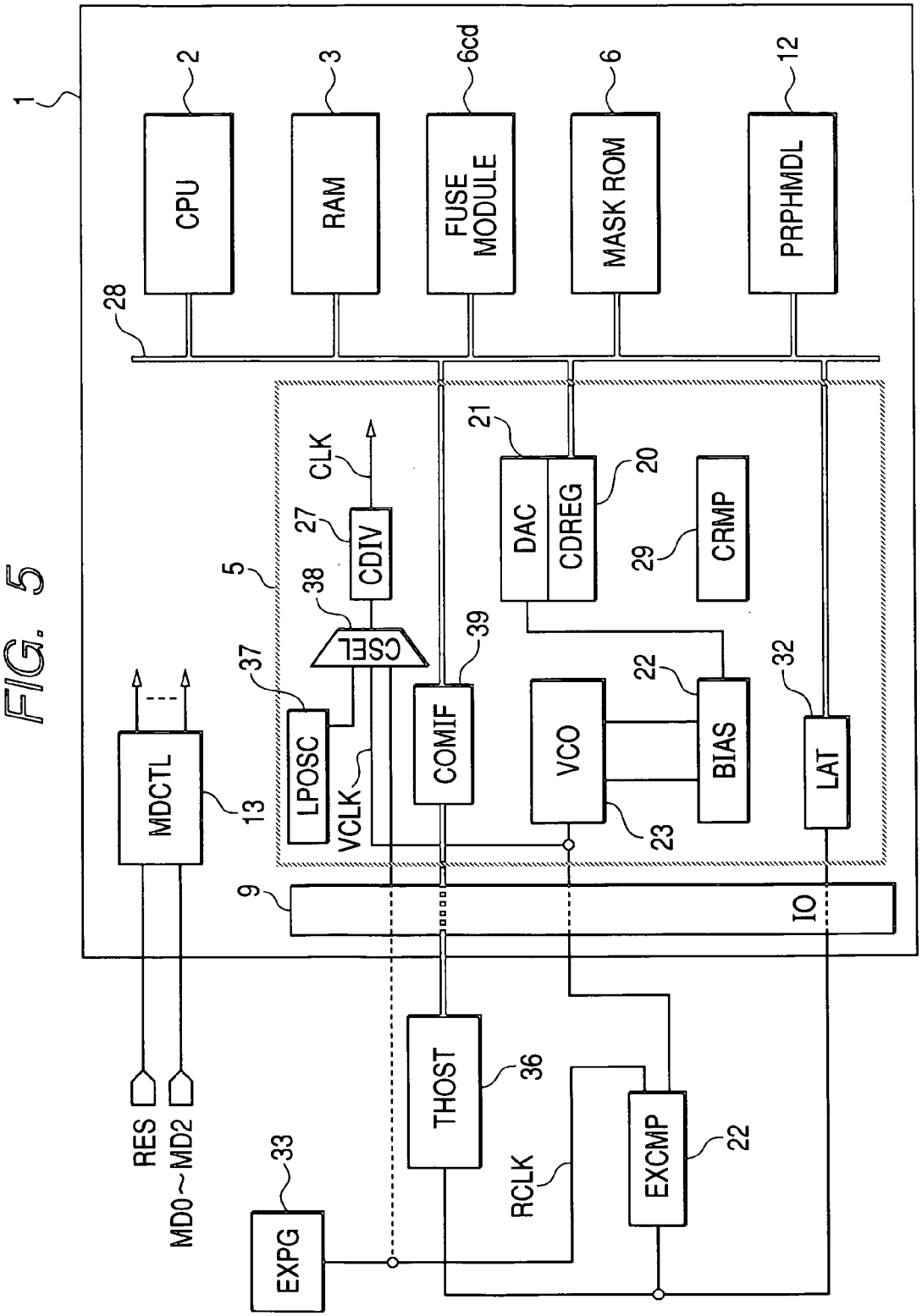
FIG. 5 is a block diagram showing a third example of the internal oscillator circuit module.

FIG. 5 shows a third example of the internal oscillator circuit module 5. In this example, the internal oscillator circuit module 5 is configured such that the frequency comparison is performed externally and a control program for the CPU 2 which is required in the frequency setting mode is received from an external test host (THOST) 36. The internal oscillator circuit module 5 has a communication interface (COMIF) 39 which receives the control program for the CPU 2 from the outside via the test host 36 or the like and a latch circuit (LAT) 32 which receives the result of the comparison made externally. Outside the internal oscillator circuit module 5, there is provided a frequency comparator circuit (EXCMP) 35 for performing a frequency comparison between the external clock signal RCLK generated in a pulse generator (EXPG) 33 and the internal clock signal VCLK generated in the VCO 23. When the frequency setting mode is set to the microcomputer 1, the CPU 2 is operated in synchronization with the clock by using the external clock signal RCLK to download the control program for setting the frequency from the outside via the communication interface 31 and store the control program in, e.g., a specified region of the RAM 3. The CPU 2 performs the process of executing the control program stored in the RAM 3, fetching the results of comparisons held in the latch circuit 32 at specified intervals, receiving control data updated in a direction to cause the frequency of the internal clock signal to coincide with the frequency of the external clock signal from the THOST 36 into the control data register 20, and updating the frequency of the internal clock signal. Otherwise, the frequency setting operation is the same as shown in FIG. 2 so that the detailed description thereof will be omitted.

In FIG. 5, a low-precision oscillator circuit (LPOSC) 37 which is low in the precision of the oscillation frequency is particularly provided and a clock selector (CSEL) 38 is allowed to select an oscillation output of the oscillator circuit 37, the external clock signal RCLK, or the internal clock signal VCLK. In the clock frequency setting mode, e.g., it is also possible to select the output of the oscillator circuit 37 instead of the external clock signal RCLK. The low-precision oscillation frequency indicates that compensation of variations in oscillation frequency against a process variation, a power supply voltage variation, and a temperature variation is not performed. As for or the VCO, it is configured to be capable of compensating for variations in oscillation frequency against a power supply voltage variation and a temperature change, as will be described later in detail.

Figure 16:
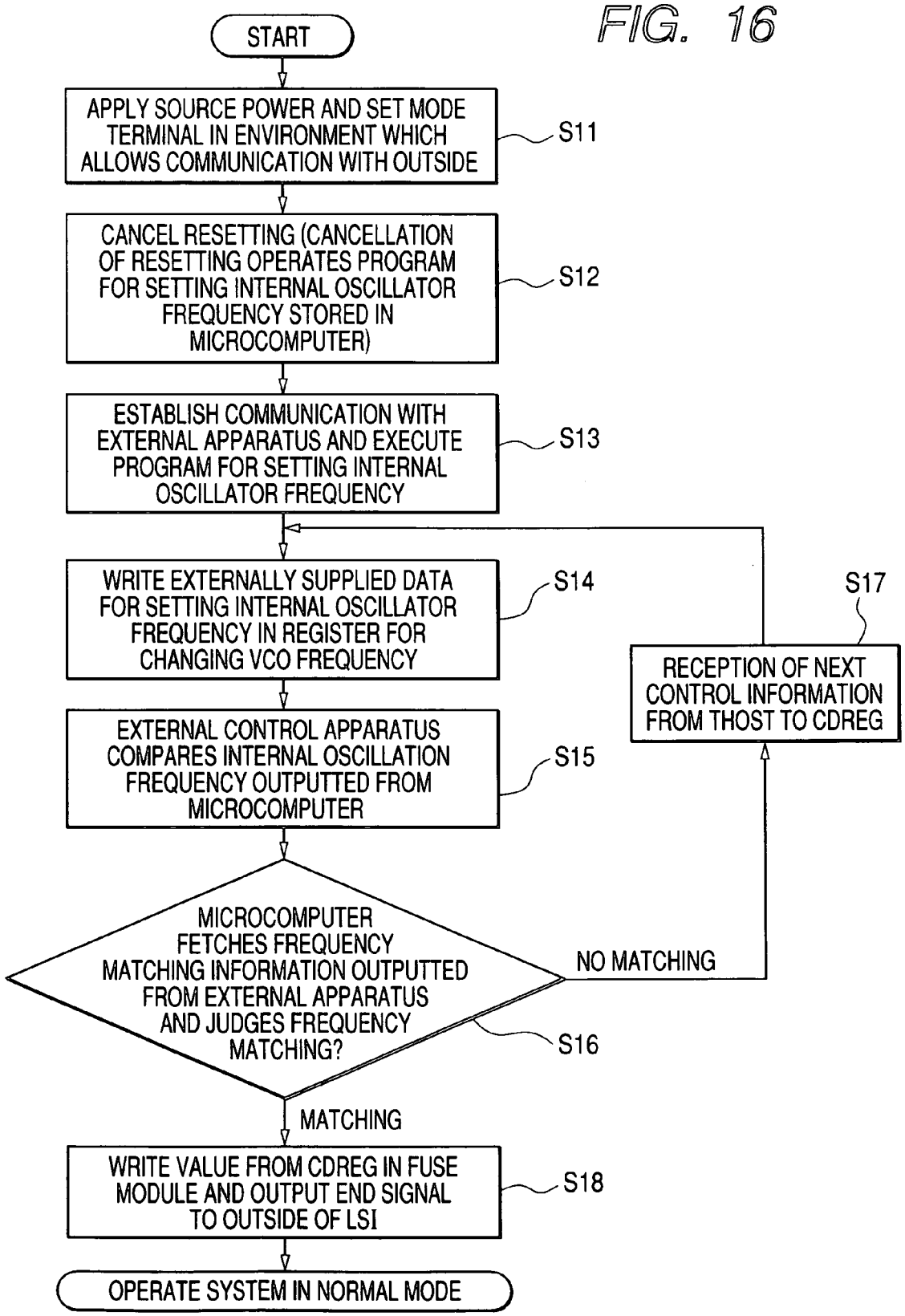
FIG. 16 is a flow chart illustrating the internal-oscillation-frequency setting operation performed through external comparison.

FIG. 16 illustrates a flow chart for the internal-oscillation-frequency setting operation performed through external comparison. Through the application of power, the inputting of the mode signals MD0 to MD2, and the inputting of the external clock signal RCLK, the power-on reset of the microcomputer 1 (S11) is performed. Upon reset cancellation, the CPU 2 starts the execution of a specified interface program based on the states of the mode signals MD0 to MD2 indicative of the frequency setting mode (S12). The CPU 2 establishes communication with the THOST 36, transfers the control program for setting the frequency to the RAM 3, and starts the execution of the transferred control program for setting the frequency (S13). The CPU 2 sets control information supplied from the outside to the CEREG 20 in accordance with the control program (S14). The THOST 36 compares the frequency of the internal clock signal with the frequency of the external clock signal (S15). The microcomputer 1 fetches the result of the external comparison, judges whether or not the frequency of the internal clock signal has coincided with the frequency of the external clock signal (S16), and receives the next control information from the THOST 36 into the CDREG 20 if there is no coincidence (S17). When a coincidence is detected, the microcomputer 1 stores the control information of the CDREG 20 in the fuse module 6cd and notifies the THOS 36 of the end of the process (S18). Thereafter, the microcomputer 1 becomes operable in the normal mode (user mode) or the like through reset.

Figure 8:
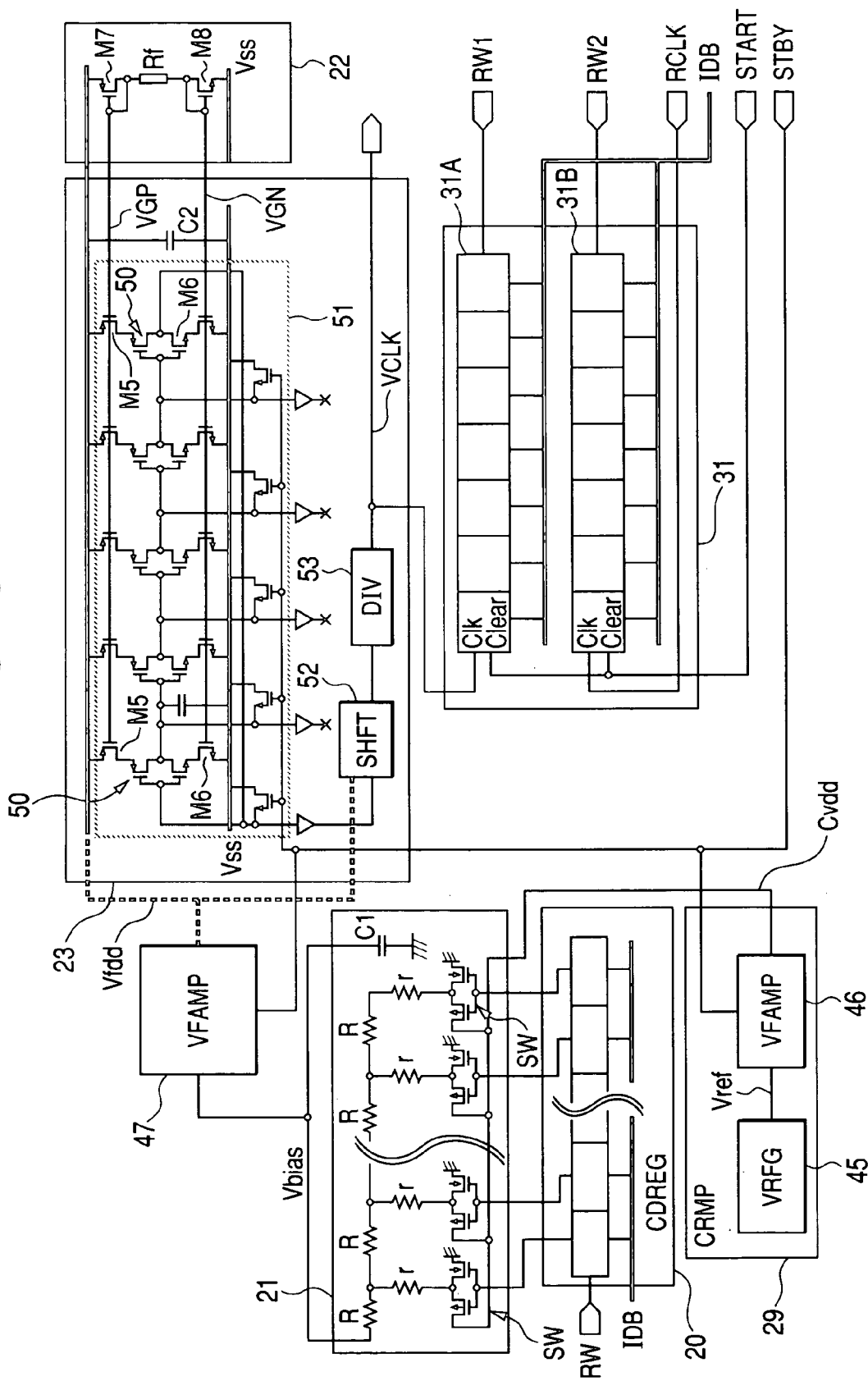
FIG. 8 is a circuit diagram showing a detailed example of a circuit corresponding to the internal oscillator circuit module of FIG. 4.
Figure 9:
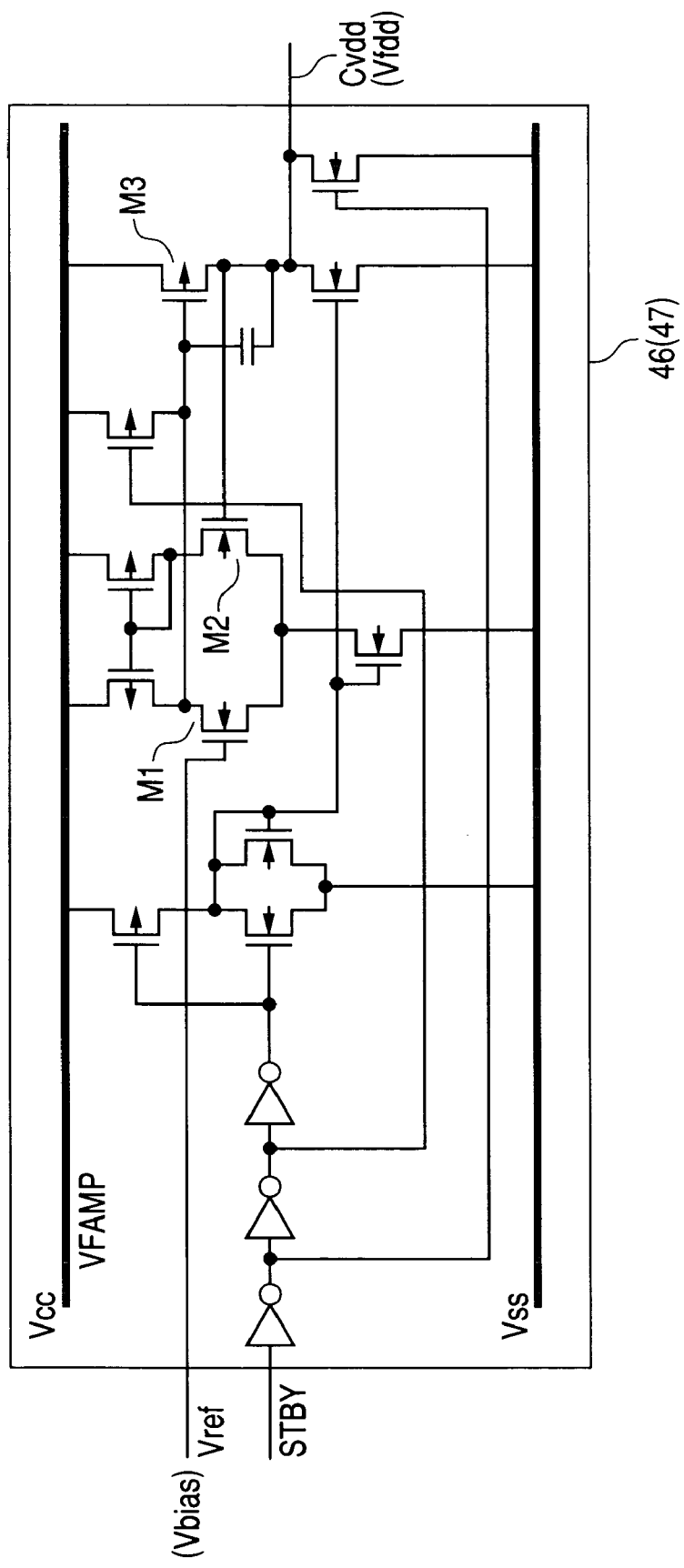
FIG. 9 is a circuit diagram showing an example of a voltage follower amplifier (VFAMP)

Power-Supply-Voltage Compensation and Temperature Compensation in Oscillator Circuit FIG. 8 shows a detailed example of a circuit corresponding to the internal oscillator circuit module 5 of FIG. 4. The clamp circuit 29 mentioned above is composed a reference voltage generator circuit (VRFG) 45 and a voltage follower amplifier (VFAMP) 46. The reference voltage generator circuit 45 generates a reference voltage Vref in which variations in response to variations in temperature and power supply voltage have been compensated for. The reference voltage generator circuit 45 generates the reference voltage by using, e.g., the difference between the threshold voltages of a pair of MOS transistors. As illustrated in FIG. 9, the voltage follower amplifier 46 is composed of a differential amplifier having differential input MOS transistors M1 and M2 as a main component, in which the reference voltage Vref is supplied to the gate of the one differential input MOS transistor M1, while the drain of an output MOS transistor M3 is feedback connected to the gate of the other input MOS transistor M2. When a standby signal STBY is brought to a HIGH level, a current dc path is cut off so that the voltage follower amplifier 46 is inactivated. The clamp circuit 29 is capable of outputting a stable clamp voltage Cvdd (in which variations have been compensated for) against variations in temperature and power supply voltage Vcc.

The clamp voltage Cvdd is used as a conversion reference voltage for the DAC 21. The DAC 21 is assumed to have a circuit configuration in a so-called R2R form having a resistor network of, e.g., series resistors R and shunt resistors r such that the clamp voltage Cvdd is applied to one end of each of the shunt resistors r via a CMOS switch SW which is turned ON/OFF based on the control information. The switching of the CMOS switch SW is controlled by the corresponding bit in the CDREG 20. C1 is a stabilized capacitance. RW is a read/write control signal to the CDREG 20.

Accordingly, a voltage Vbias outputted from the DAC 21 in accordance with the control information also becomes stable relative to variations in temperature and power supply voltage Vcc. Since the output of the D/A converter circuit 21 is low in impedance, the voltage Vbias is used as an operating power supply voltage Vfdd of each of the VCO 23 and the BIAS 22 through the voltage follower amplifier (VFAMP) 47 having the circuit configuration shown in FIG. 9. Along with the VCO 23, the operating power supply voltage Vfdd of the BIAS 22 is stabilized relative to variations in temperature and power supply voltage Vcc. In short, the operating-power-supply-voltage compensation of the VCO 23 is performed.

The VCO 23 has a ring oscillator portion 51 composed of an add number of CMOS inverter delay stages 50. The CMOS inverter delay stages 50 are configured to have a p-channel current-limit MOS transistor M5 on the side with the operating power supply of the CMOS inverters and an n-channel current-limit MOS transistor M6 on the ground voltage side of the circuit. A bias voltage VGP is supplied to the gate of the current-limit MOS transistor M5, while a bias voltage VGN is supplied to the gate of the current-limit MOS transistor M6, so that the conductance of the CMOS inverter delay stages 50 is controlled. The ring oscillator portion 51 halts an oscillating operation when the standby signal STBY is at the HIGH level and starts the oscillating operation when the standby signal STBY is inverted to the LOW level. The transient response time of the CMOS inverter delay stages 50 is controlled by the bias voltages VGP and VGN, which makes it possible to control the oscillation frequency of the VCO 23. C2 is a stabilized capacitance.

The bias circuit 22 is configured to form the bias voltages VGP and VGN and compensate for variations caused therein by a temperature change. Specifically, the bias circuit 22 constitutes a constant current circuit comprising: a p-channel first MOS transistor M7 having a source which receives the operating power supply voltage vfdd and a gate and a drain which are short-circuited; an n-channel second MOS transistor M8 having a source which receives the ground voltage Vss of the circuit and a gate and a drain which are short-circuited; and a resistor element Rf having one end coupled to the drain of the first MOS transistor M7 and the other end coupled to the drain of the second MOS transistor M8. The bias circuit 22 outputs the drain voltage of the first MOS transistor M7 as the bias voltage VGP and outputs the drain voltage of the second MOS transistor M8 as the bias voltage VGN. As shown by the respective Vgs-Ids characteristics of the MOS transistors illustrated in FIG. 10, each of the MOS transistors has a region in which Ids is constant relative to temperature. The value of the resistor Rf is determined to operate each of the first and second MOS transistors M7 and M8 in this region. This satisfies a condition for a gate-to-source voltage under which a change in the drain-to-source current in response to a temperature change is reduced in each of the first and second MOS transistors M7 and M8. In short, the bias circuit 22 allows a constant current to flow therein even in response to a temperature change. Since the VCO 23 receives the bias voltages VGP and VGN thereof at the current-limit MOS transistors M5 and M6 to have its conductance controlled, the VCO 23 also allows a constant current to flow therein even in response to a temperature change similarly to the bias circuit 22 and thereby implements the temperature compensation of the frequency of the internal clock signal VCLK.

Figure 10:
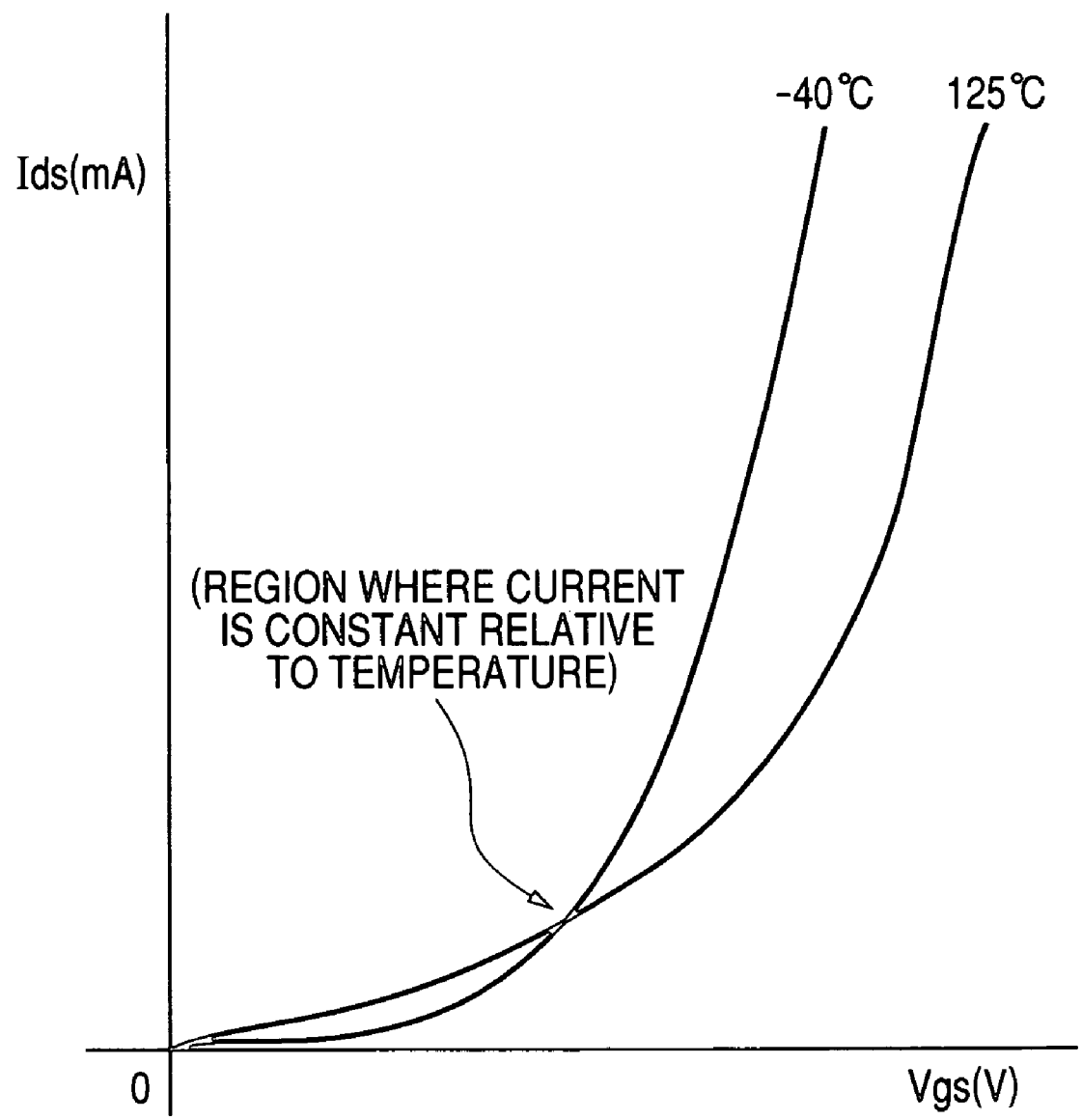
FIG. 10 is a view illustrating the Vgs-Ids characteristic of a MOS transistor.

Since the condition for temperature compensation using the bias circuit 22 is satisfied by providing the gate-to-source voltage which satisfies the characteristics illustrated in FIG. 10, a significant change in operating power supply voltage Vfdd is disadvantageous. In regard to this point, the configuration of FIG. 8 has a frequency variable range greatly limited. In short, the configuration is limited to applications at a substantially constant frequency.

Figure 18:
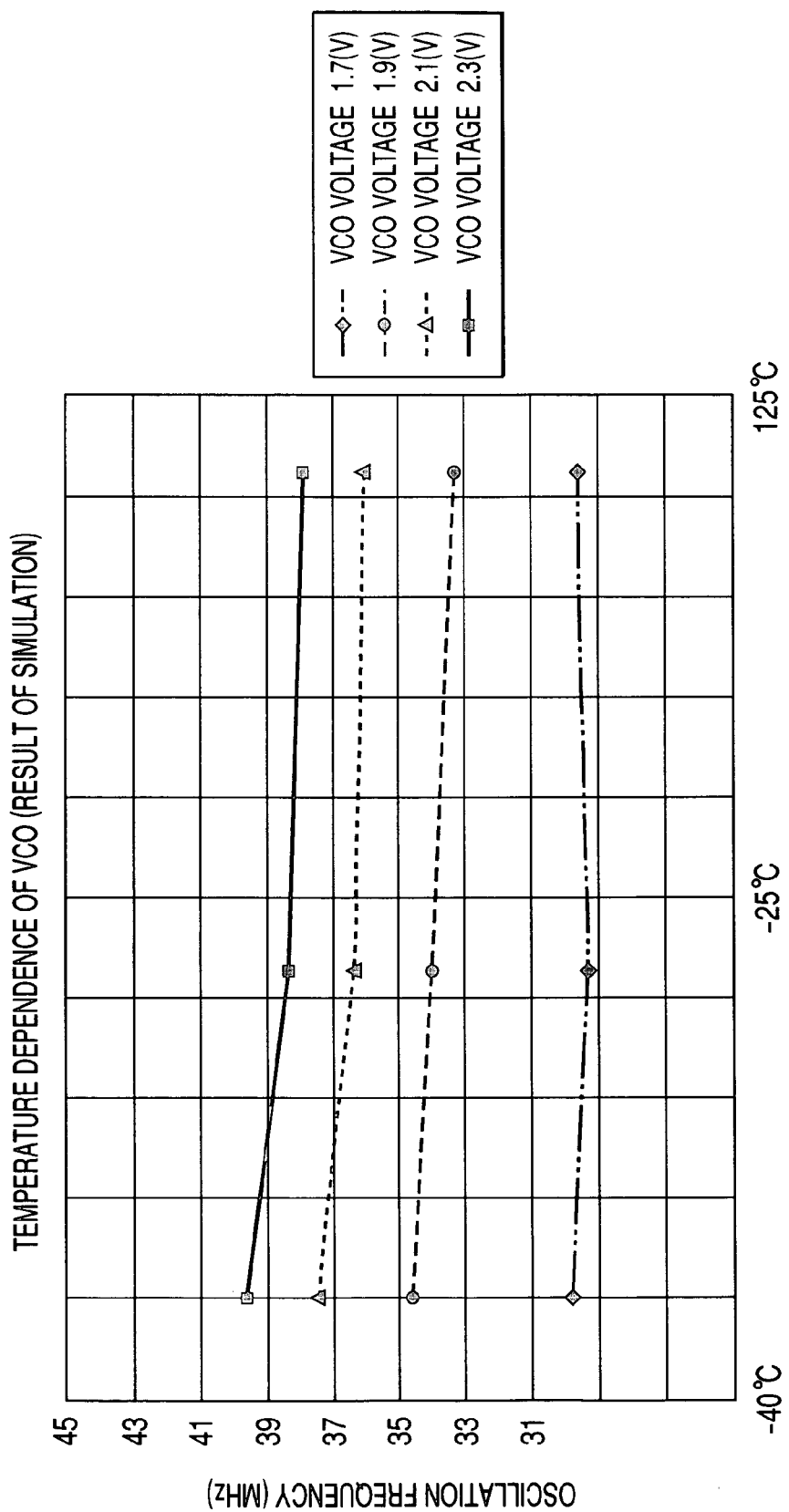
FIG. 18 is a view illustrating the result of simulation related to the temperature dependence of VCO in the configuration of FIG. 8.

FIG. 18 illustrates the result of simulation related to the temperature dependence of the VCO in the configuration of FIG. 8. FIG. 18 shows several examples in which the VCO voltage, i.e., the control voltage is different. The illustrated oscillation frequencies present reduced temperature dependence relative to the corresponding control voltages. As stated previously, the configuration of FIG. 8 is limited to applications at a substantially constant frequency so that the result of simulating four types of circuits is shown in FIG. 18.

In the example shown in FIG. 8, a level shift from vfdd to Vcc is performed in a level shifter (SHFT) 52 relative to the oscillation output of the ring oscillator portion 51. An output of the level shifter is subjected to ½ frequency division in a frequency divider (DIV) 53 to provide the internal clock signal VCLK. The frequency divider 53 is provided in consideration of duty correction. The ratio of frequency division may be increased when timing is strict or, when timing is not strict, the frequency divider 53 may not be used. An increase in the ratio of frequency division of the frequency divider 53 indicates an increase in the oscillation frequency of the ring oscillator portion 51.

In FIG. 8, RW1 indicates a read/write control signal to the counter 31A and RW2 indicates a read/write control signal to the counter 31B. A start signal START is inputted to the clear terminal of each of the counters 31A and 31B. For example, the start signal START indicates the clearing of a count value when it is at the LOW level and indicates the starting of counting when it is at the HIGH level.

Figure 14:
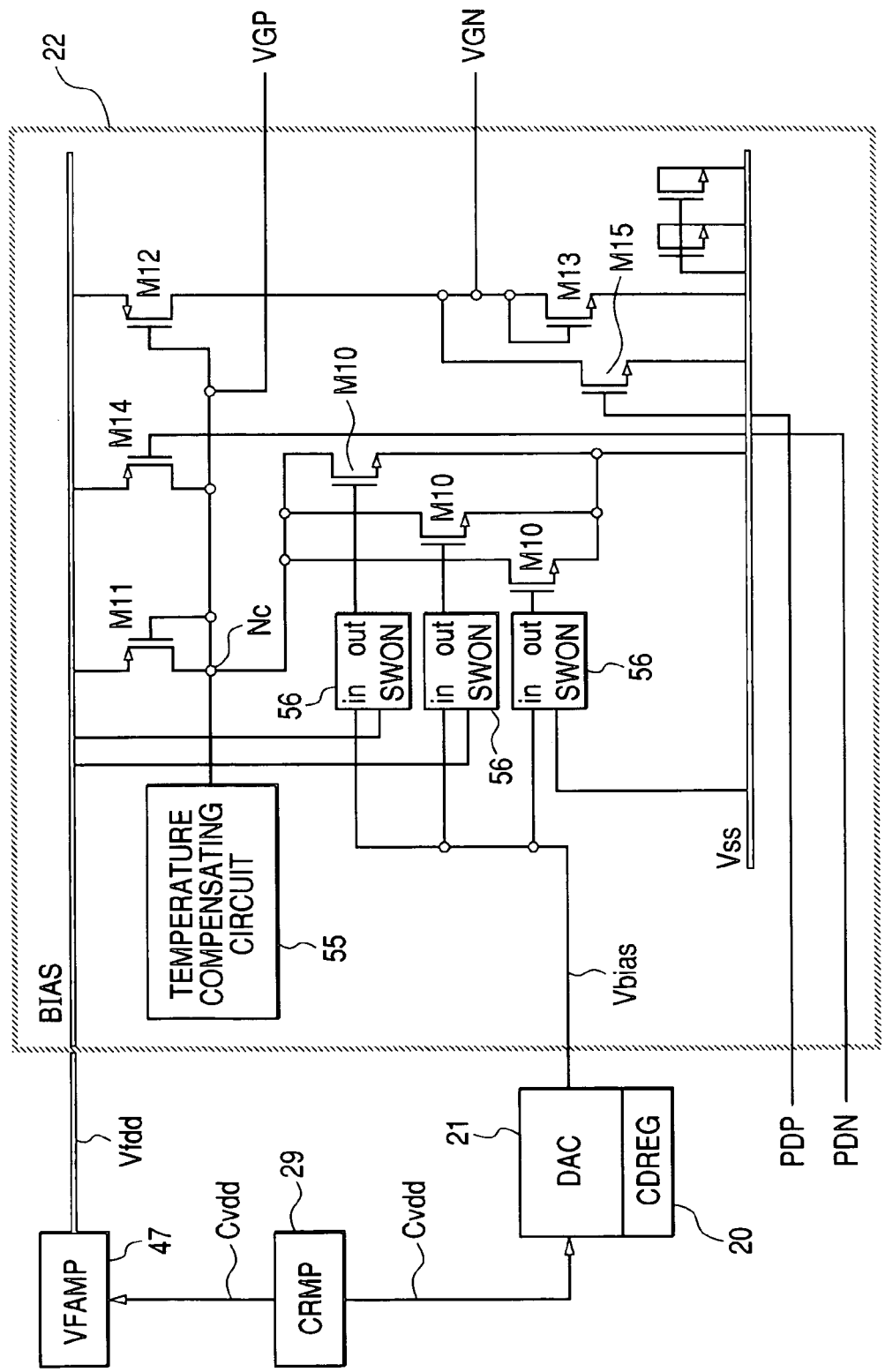
FIG. 14 is a circuit diagram showing another example of a bias circuit.

FIG. 14 shows another example of the bias circuit. In contrast to the example of FIG. 8 or the like which is limited to the use of the constant current region relative to the temperature as shown in FIG. 10, such a limit is not provided in the example shown herein. The bias circuit 22 has three n-channel MOS transistors M10 in parallel each of which has its conductance controlled by the bias voltage Vbias. In the MOS transistor M10, a current path from Vfdd to Vss is formed via a load MOS transistor M11 having a gate and a drain connected to each other. A midway node Nc in the current path is set at the one control voltage VGP. A p-channel MOS transistor M12 having a gate which receives the voltage at the midway node Nc and a load MOS transistor M13 having a gate and a drain connected to each other form another current path so that the drain of the MOS transistor M13 is set at the other control voltage VGN. When the level of the input voltage Vbias of the bias circuit 22 becomes higher, the level at the node Nc becomes lower and the conductance of the MOS transistor M12 becomes larger, whereby the level of VGP is lowered and the level of VGN is raised. As a result, the operating current in the CMOS delay stages 50 illustrated in FIG. 8 and the like increases to raise the oscillation frequency. Conversely, when the level of the input voltage Vbias of the bias circuit 22 becomes lower, the level at the node Nc becomes higher so that the level of VGP rises and the level of VGN drops. As a result, the operating current in the CMOS delay stages 50 illustrated in FIG. 8 and the like is reduced to lower the oscillation frequency. In the example of FIG. 14, a temperature compensator circuit 55 is provided in terms of temperature compensation to supply a current necessary for temperature compensation to the node Nc. When a frequency variation due to, e.g., a variation in the VLT (logic threshold voltage) of the VCO presents a problem, the temperature compensator circuit 55 can be configured by using a logic threshold voltage generator circuit, an operational amplifier, and the like, though it is not particularly depicted. Numeral 56 is a selection switch circuit for controlling an input to the gate of the MOS transistor M10, which is capable of selecting between an input from a terminal SWON and an input from a terminal in. When the input from the terminal SWON is selected, the conductance of the corresponding MOS transistor M10 is held constant irrelevantly to Vbias. M14 and M15 are MOS transistors for setting the control voltage VGP to Vdff and the control voltage VGN to Vss.

Temperature Dependence Compensation Focusing Attention on VLT

Figure 19:
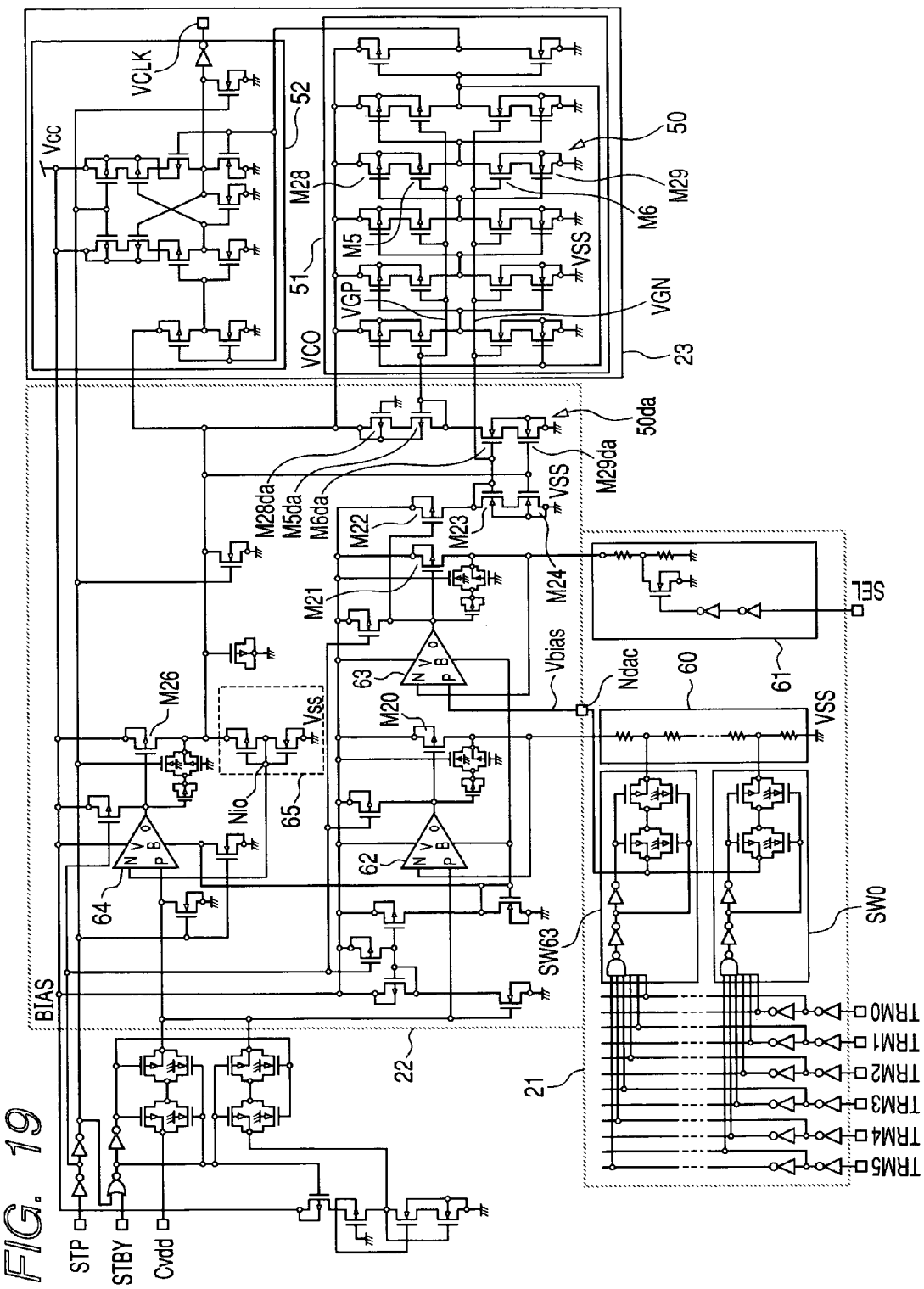
FIG. 19 is a circuit diagram showing a circuit example of the internal oscillator circuit module which performs temperature compensation by focusing attention on VLT.

FIG. 19 shows a circuit example of the internal oscillator circuit module 5 which performs temperature compensation by focusing attention on VLT. A detailed description will be given primarily to another circuit example of the BIAS 5. Another circuit configuration is also adopted herein for the DAC 21. By using switch circuits SW0 to SW63, the voltage dividing tap of a series resistor circuit 60 is selected in accordance with the values of control information sets TRM0 to TRM5 to obtain an analog voltage at a node Ndac. The circuit denoted by 61 is a circuit for generating a current corresponding to the analog voltage at the node Ndac. The current value can be switched with a signal SEL.

Figure 20:
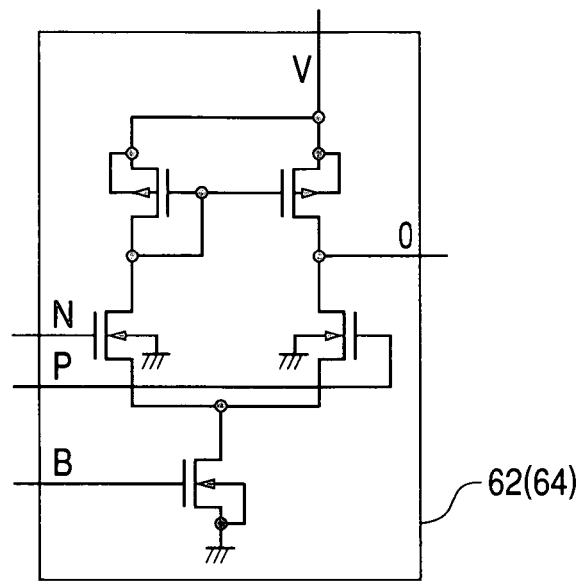
FIG. 20 is a circuit diagram illustrating the operational amplifiers 62 and 64 shown in FIG. 19.
Figure 21:
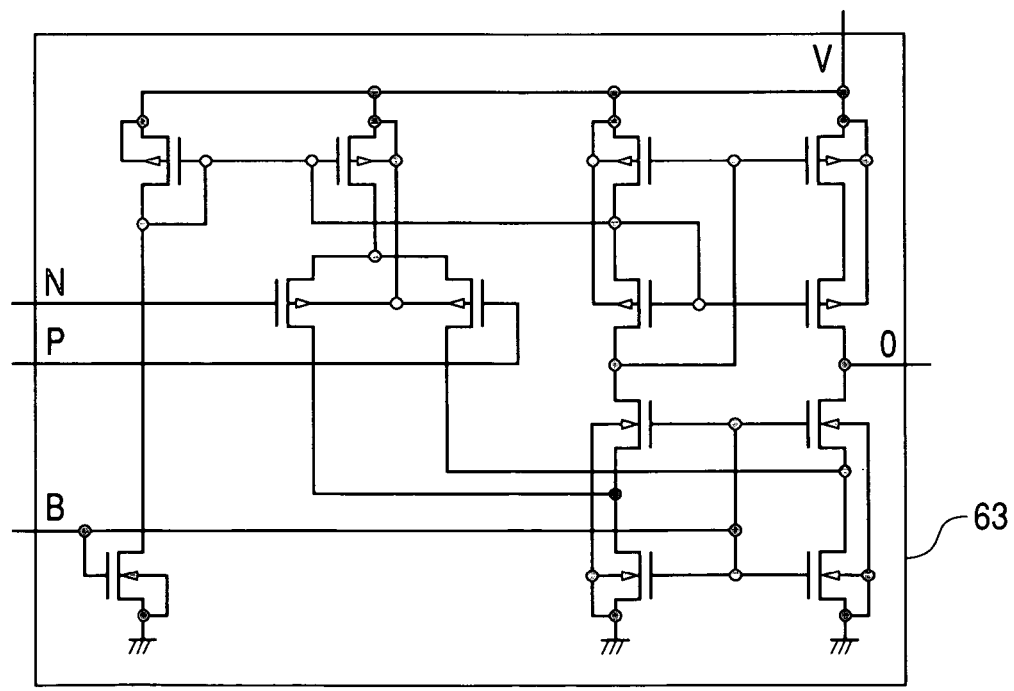
FIG. 21 is a circuit diagram illustrating the operational amplifier 63 shown in FIG. 19.

The bias circuit 22 has three operational amplifiers 62 to 64. Each of the operational amplifiers 62 and 64 has a circuit configuration illustrated in FIG. 20. The operational amplifier 63 has a circuit configuration illustrated in FIG. 21. A p-channel MOS transistor M20 having its conductance controlled by the output of the operational amplifier 62 and the series resistor circuit 60 form a current path between the power supply voltage Vcc and the ground voltage Vss of the circuit. The operational amplifier 62 has an inverted input terminal N to which a divided voltage from the series resistor circuit 60 is feedbacked and a non-inverted input terminal to which the output voltage Cvdd of the clamp circuit 29 is supplied to control the conductance of the MOS transistor M20 with the output voltage responsive to the voltage difference therebetween. In short, the operating voltage for the series resistor circuit 60 as the conversion reference voltage for the DAC 21 is used as the clamp voltage Cvdd. The operational amplifier 63 controls the conductance of the MOS transistor M21 such that a voltage equal to the analog converted voltage Vbias at the node Ndac is formed at the drain of the MOS transistor M21. Accordingly, a current flowing in the MOS transistor M21 is determined by the analog converted voltage Vbias and by a resistance in the circuit 61 and has a constant current property relative to the power supply voltage Vcc. The current is transmitted to a MOS transistor M22 at a specified Miller ratio. The MOS transistor M22 constitutes a current path in conjunction with n-channel MOS transistors M23 and M24 connected in series between Vcc and Vss. The drain voltage of the MOS transistor M22 is supplied as the one control voltage VGN to the VCO 23.

The bias circuit 22 has a logic threshold voltage simulator circuit 65. The logic threshold voltage simulator circuit 65 has a circuit configuration in which the input/output of a CMOS inverter are short-circuited and forms, at a short-circuited input/output terminal Nio, a logic threshold voltage (VLT) relative to the operating power supply voltage thereof. The logic threshold voltage simulator circuit 65 forms a current path in conjunction with a p-channel MOS transistor M26 connected in series between Vcc and Vss. The operational amplifier 64 has an inverted input terminal (N) to which the node Nio of the logic threshold voltage simulator circuit 65 is feedback connected and a non-converted input terminal (P) to which the output voltage Cvdd of the clamp circuit 29 is supplied so that the conductance of the MOS transistor M26 is negatively feedback controlled based on the voltage difference therebetween. A voltage determined by Cvdd and VLT is formed at the drain of the MOS transistor M26. For example, such a voltage as 2×Cvdd is formed. The voltage is used as the operating power supply voltage of the VCO 23.

The bias circuit 22 has a dummy circuit 50da of the CMOS delay stages 50. In the CMOS delay stages 50 shown herein, each of the current-limit MOS transistors M5 and M6 is disposed at the center portion and each of a p-channel MOS transistor M28 and an n-channel MOS transistor M29 composing the CMOS inverter is disposed externally of the current-limit MOS transistors M5 and M6. The dummy circuit 50da is composed of MOS transistors M28da, M5da, M6da, and M29da. The drain voltage of the MOS transistor M26 is supplied to the gate of the MOS transistor M29da and Vss is supplied to the gate of the MOS transistor M28da, while the one control voltage VGN is supplied to the gate of the MOS transistor M6da, whereby the voltage at the common gate/drain terminal of the MOS transistor M5da is used as the other control voltage VGP to allow the current flowing in the MOS transistor M5da to be reflected on each of the CMOS delay stages 50 of the VCO 23.

The current flowing in each of the MOS transistors M5da and M6da is a Miller current which is a constant current flowing in the MOS transistor M21. It follows therefore that a drain current flowing in each of the current-limit MOS transistors M5 and M6 in each of the CMOS delay stages 50 in the VCO 23 which receive the control voltages VGN and VGP also has a constant current property. The gate capacitance of the CMOS inverter composed of the MOS transistors M28 and M29 in the next CMOS delay stage 50 is charge/discharge-driven by the constant current and the charge/discharge time constant becomes a delay element. The constant current is generated from the D/A converted voltage Vbias formed by using the clamp voltage Cvdd as the reference and a resistance. Since the operating power supply voltage of the VCO 23 is also a voltage formed by using Cvdd as the reference, compensation against a process variation and compensation against a power supply variation can be implemented. Further, the logic threshold voltage simulator circuit 65 causes the MOS transistor M26 to output a voltage such that the logic threshold voltage VLT thereof becomes equal to Cvdd. Since the outputted voltage is given as the operating power supply voltage of the VCO 23, the logic threshold voltage of the CMOS inverter composed of the MOS transistors M28 and M29 in the CMOS delay stages 50 can always be controlled constant and a variation in the oscillation frequency of the ring oscillator portion can be compensated for even against a temperature change.

For example, when the logic threshold voltage of the CMOS inverter tends to rise with a temperature rise, the drain voltage of the MOS transistor M26, i.e., the operating power supply voltage of the VCO 23 drops to suppress a variation in the logic threshold voltage of the CMOS inverter. The rising of the logic threshold voltage of the CMOS inverter with the temperature rise indicates that the ability of the p-channel MOS transistor to drive the current relative to the n-channel MOS transistor has relatively improved. Controlling the logic threshold voltage constant by lowering the power supply voltage leads to control in a direction to narrow the source-to-gate voltage VGS when the p-channel MOS transistor has started operation so that the improvement of the current driving ability is suppressed.

In a delay in the output of the CMOS delay stages 50, a time required to charge/discharge the next-stage gate capacitance using the constant current in each of the current-limit MOS transistors M5 and M6 is a principal element, as described above. However, the characteristics of the MOS transistors M28 and M29 composing the CMOS inverter also intervene immediately after the output of each of the CMOS delay stages 50 has started to be inverted. When the output of the CMOS delay stages 50 starts a rise from 0 V, e.g., the MOS transistor M28 shifts from the OFF state to the ON state. During the shift period, however, the output current characteristic of the MOS transistor M28 influences a rise in output voltage. The same shall apply to the MOS transistor M29 when the output thereof lowers. By thus controlling the logic threshold voltage of the CMOS inverter constant, it becomes possible to hold the influence of each of the MOS transistors M28 and M29 on the delay characteristics of the CMOS delay stages 50 constant. This changes the control voltages VGN and VGP and the operating power supply voltage of the VCO 23 to voltages correlated to the D/A converted voltage Vbias formed by using the clamp voltage Cvdd and to the logic threshold voltage VLT mentioned above so that compensation against a process variation and compensation against a power supply variation is implemented. Since the logic threshold voltage simulator circuit 65 gives, to the ring oscillator portion, a current in a direction to cancel out a current change caused by a logic threshold voltage variation in the CMOS circuit, a variation in the oscillation frequency of the ring oscillator portion caused by a temperature change can also be compensated for.

It is to be noted that, in FIG. 19, the depiction of the frequency divider is omitted.

Figure 22:
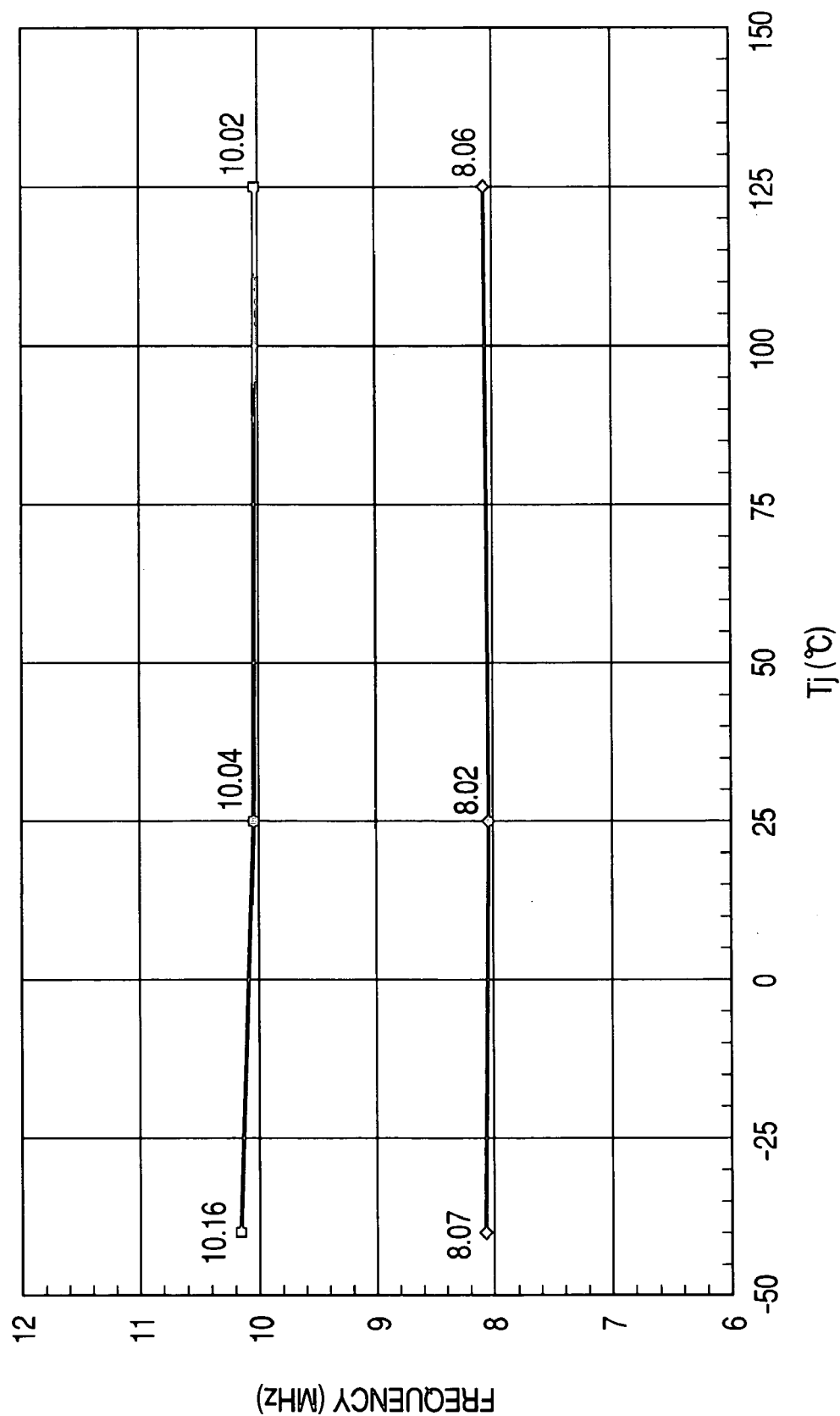
FIG. 22 is a view illustrating the result of simulation related to the temperature dependence of VCO in the configuration of FIG. 19.

FIG. 22 illustrates the result of simulation related to the temperature dependence of the VCO in the configuration of FIG. 19. The temperature dependence has been reduced at the illustrated oscillation frequencies.

Frequency Setting Step

Figure 23:
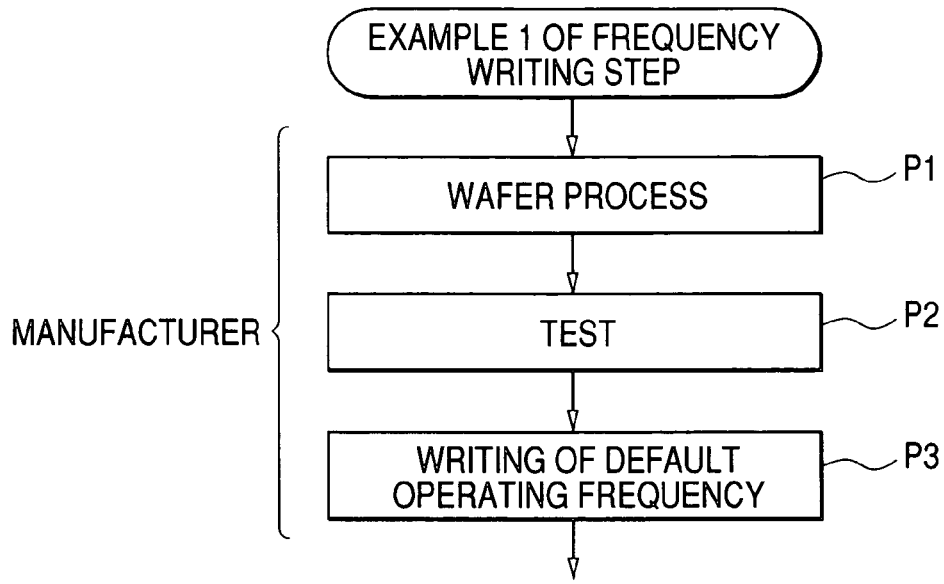
FIG. 23 is a flow chart illustrating a frequency setting step in a process of manufacturing a microcomputer, especially a versatile microcomputer.

FIG. 23 illustrates a frequency setting step in a process of manufacturing the microcomputer 1 described above. The microcomputer 1 shown herein assumes a versatile microcomputer. That is, a microcomputer which adopts an internal oscillator circuit module to which a non-restrictive frequency can be set, as illustrated in FIG. 19, is assumed to be a target.

At a manufacturer, a wafer process (P1) and a test (P2) are performed and then control information for determining a default operating frequency is written in the fuse module 6cd in accordance with the specifications of a customer (P3). The test (P2) may also be performed by using an external clock signal without using internal oscillation. Alternatively, it is also possible to initially incorporate an internal oscillation frequency into a tester and then perform the test, while changing the internal oscillation frequency. Thereafter, the system is made operable at the set internal oscillation frequency in a normal mode (user mode).

Figure 24:
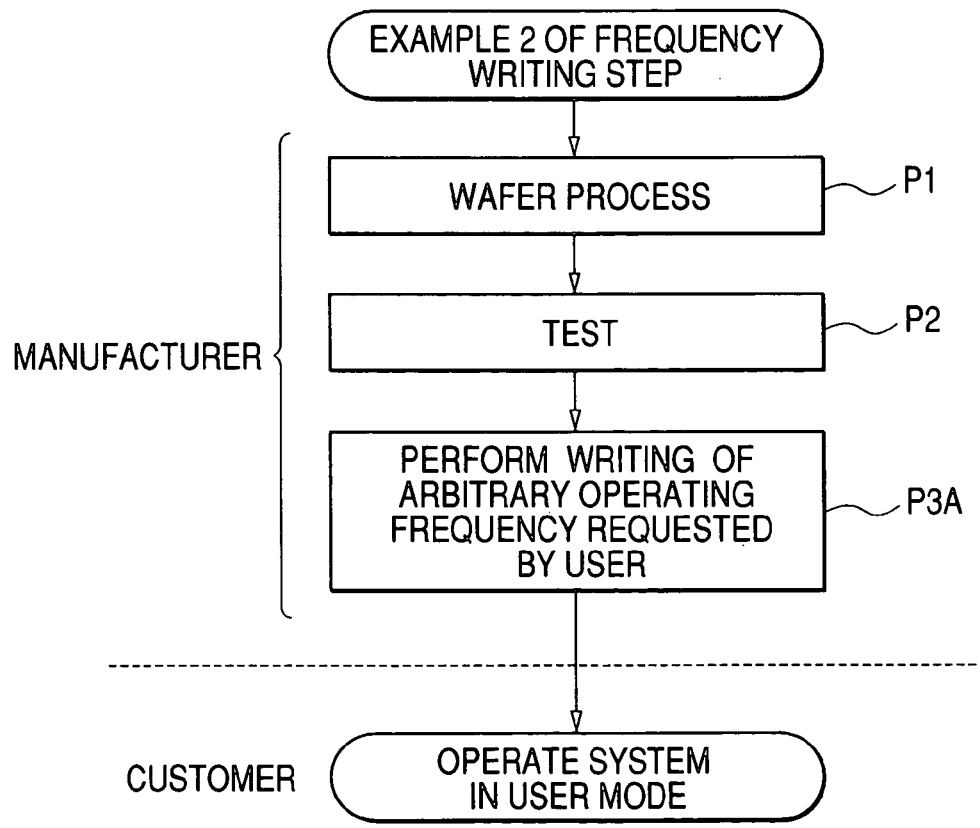
FIG. 24 is a flow chart illustrating the frequency setting step in the process of manufacturing a microcomputer, especially a custom LSI.

FIG. 24 shows another example of the frequency setting step in the process of manufacturing the microcomputer 1, which assumes a custom LSI. Accordingly, a microcomputer may also be used which adopts an internal oscillator circuit module to which a non-restrictive frequency can be set, as illustrated in FIG. 8.

At the manufacturer, the wafer process (P1) and the test (P2) are performed and then the control information for determining an arbitrary operating frequency requested by a customer is written in the fuse module (P3A). After shipment, the system is made operable at the set internal oscillation frequency in the normal mode (user mode). There is no need to assume a frequency change after the shipment.

Dynamic Adjustment of Clock Signal Frequency

Figure 25:
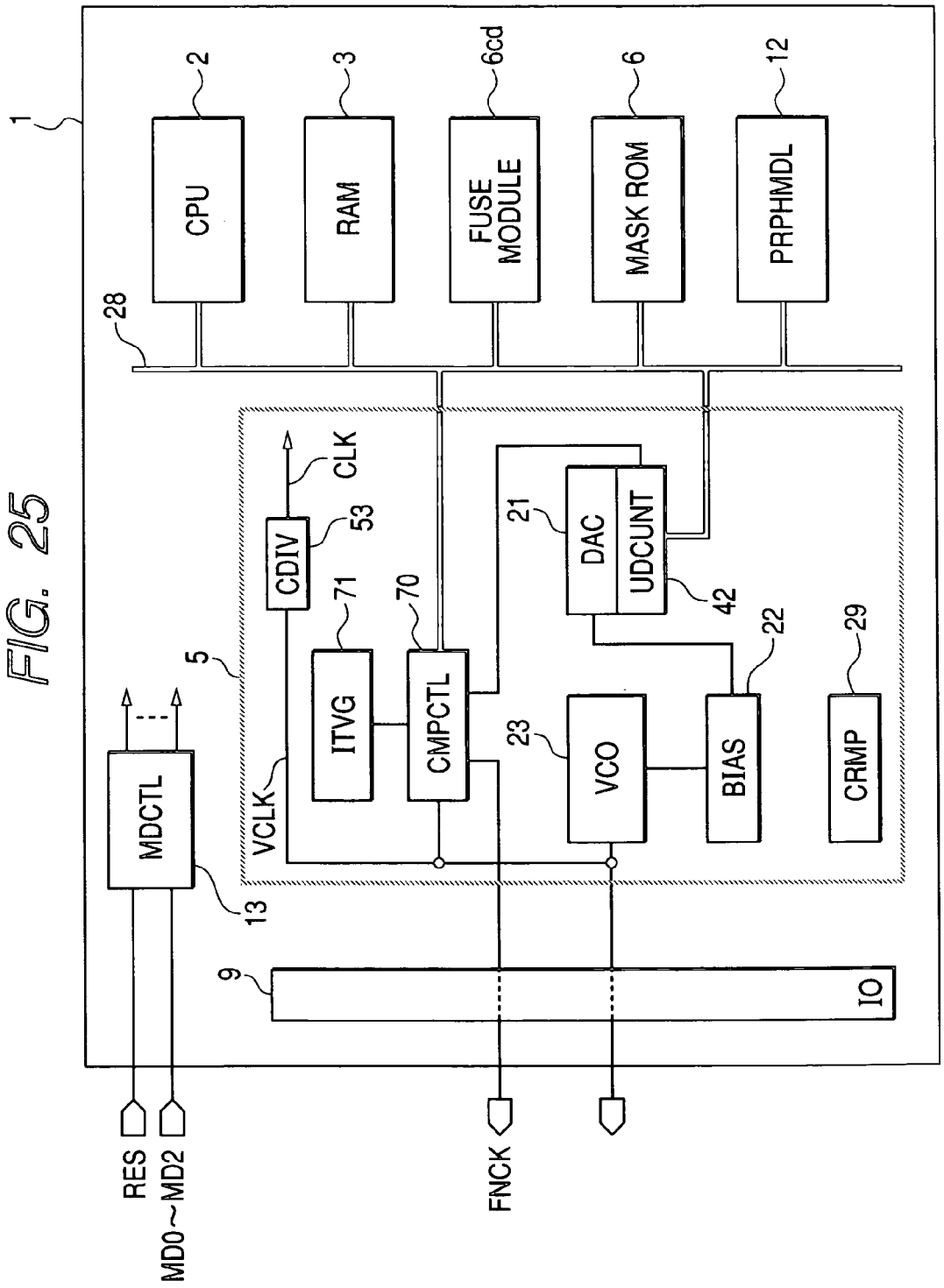
FIG. 25 is a block diagram illustrating a microcomputer comprising an internal oscillator circuit module which successively performs dynamic adjustment of an internal oscillation clock frequency.

FIG. 25 shows the microcomputer 1 comprising the internal oscillator circuit module which successively performs dynamic adjustment of an internal oscillation clock frequency. The internal oscillator circuit module 5 shown herein does not need the external clock signal RCLK for setting the frequency but provides an interval generator circuit (ITVG) 71 for periodically generating a fixed interval or section of a pulse and uses a comparator control circuit (CMPCTL) 70 which counts the internal clock signal VCLK for each fixed interval of the pulse periodically generated and updates control information in a direction to cause the count value to coincide with an expected value. As a memory circuit for storing the control information, an up-down counter (UDCUNT) 42 which is pre-settable by the CPU 2 is used herein such that the up-counting and down-counting of the up-down counter (UDCUNT) 42 is controlled by the comparator control circuit 70.

Figure 26:
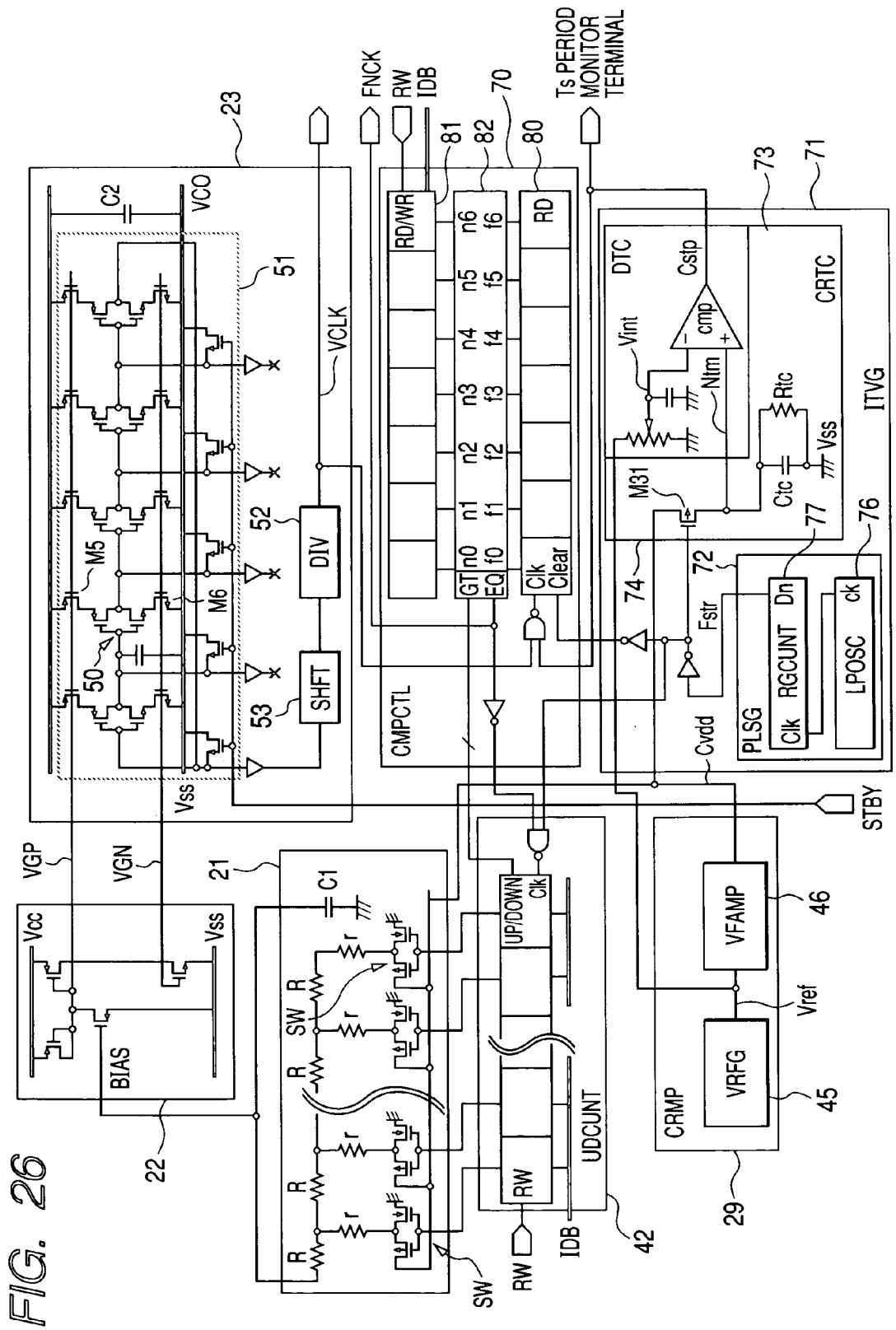
FIG. 26 is a circuit diagram illustrating a detailed example of a circuit corresponding to the internal oscillator circuit module of FIG. 23.

FIG. 26 shows a detailed example of a circuit corresponding to the internal oscillation circuit module 5 of FIG. 25. The interval generator circuit (ITVG) 71 has a pulse generator circuit (PLSG) 72, a CR time constant circuit (CRTC) 73 for performing either a charging operation or a discharging operation from a specified phase point in a pulse generated from the pulse generator circuit 72, and a detector circuit (DTC) 74 for detecting the reaching of a prescribed voltage by a voltage obtained in the CR time constant circuit 73.

The pulse generator circuit 72 is composed of a low-precision internal oscillator (LPOSC) 76 and a ring counter (RGCUNT) 77 for counting an output clock signal therefrom. The most significant bit Dn of the ring counter 77 outputs a count-up pulse Fstr. The count-up pulse Fstr is kept at the LOW level till each count-up operation and brought to the HIGH level by each count-up operation.

The CR time constant circuit 73 has a parallel circuit of a resistor Rtc and a capacitor Ctc and is connected to the clamp voltage Cvdd via a p-channel MOS switch M31. The MOS switch M31 is brought into the ON state in response to the HIGH level of the count-up pulse Fstr, whereby the Ctc is charged. The MOS switch M31 is brought into the OFF state in response to the LOW level of the count-up pulse Fstr, whereby the capacitance Ctc is discharged. The charge/discharge voltage obtained by the time constant circuit 73 is shown as Ntm. A time constant which defines a charge/discharge time period is determined by trimming the value of the resistor Ttc. A voltage trimming technique is not particularly limited but is to be implemented by using an aluminum master slice or a fuse program. The resistance value of the resistor Rtc is adjusted to such a size that the ON-resistance of the MOS switch M31 is invisible. In short, the resistor Rtc has such a large resistance value as to render the ON-resistance ignorable.

The detector circuit 74 compares the charge/discharge voltage Ntm with a judgment level Vint obtained by performing resistive voltage division with respect to the reference voltage Vref. Cstp is a signal representing the result of a comparison made by the detector circuit 74.

Figure 27:
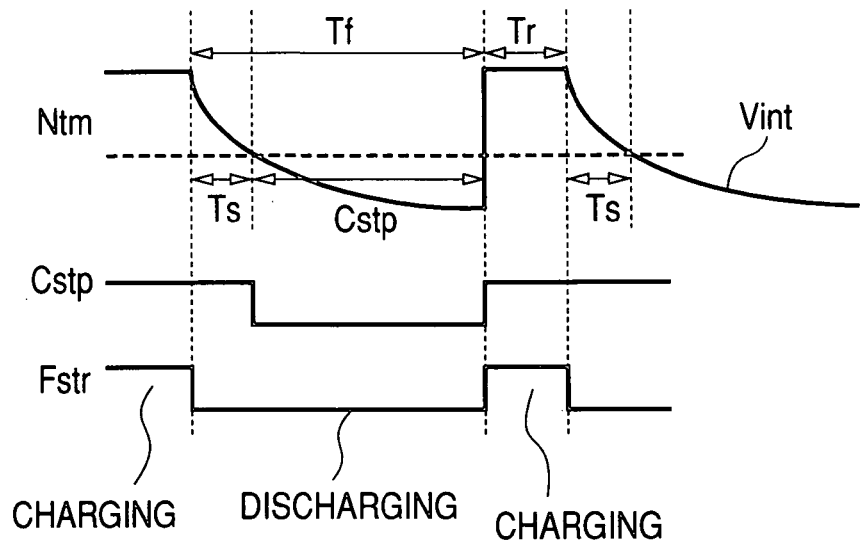
FIG. 27 is a timing chart illustrating a fixed interval (Ts) generated through the charging/discharging operation of the time constant circuit of FIG. 26.

The charge voltage obtained by the CRTC 73 is defined by the clamp voltage Cvdd and stabilized relative to variations in temperature and power supply voltage Vcc. The time constant defined by the resistor Rtc and the capacitor Ctc does not depend on variations in temperature and power supply voltage Vcc. The judgment level Vint does not depend on variations in temperature and power supply voltage Vcc, either. Accordingly, as shown in FIG. 27, the time Ts from the initiation of discharging by the time constant circuit till the voltage Ntm reaches the judgment level Vint is fixed. It is assumed that the fixed interval spans from the falling edge of Fstr to the outputting of a coincidence (the falling edge of Cstp) from the detector. The time Ts is assumed to be a time of, e.g., 100 ms.

The CMPCTL 70 has a clock counter 80 for the internal clock signal VCLK. The clock counter 80 is cleared with the timing of the falling edge of the signal Fstr and then counts the internal clock signal VCLK till the falling edge of the signal Cstp. The counting period is assumed to be a period which is fixed relative to the time Ts. The counting period is also assumed to be a fixed period not dependent on variations in temperature and power supply voltage Vcc. The count value resulting from the counting during the period Ts is compared with the preset value in a frequency setting register 81 by a comparator circuit 82. The comparator circuit 82 is assumed to be a magnitude comparator which counts up or down the UDCUNT 42 by using Fstr as a count clock depending on the magnitude of the result of the comparison and the control information is incremented by +1, decremented by −1, or held at the previous value in each cycle of the signal Fstr. As a result, it becomes possible to dynamically adjust the oscillation frequency of the oscillator circuit 23 by using the fixed interval Ts of the pulse as a reference in each cycle of the pulse Fstr such that it coincides with a target frequency without being influenced by variations in temperature and power supply voltage Vcc.

Figure 28:
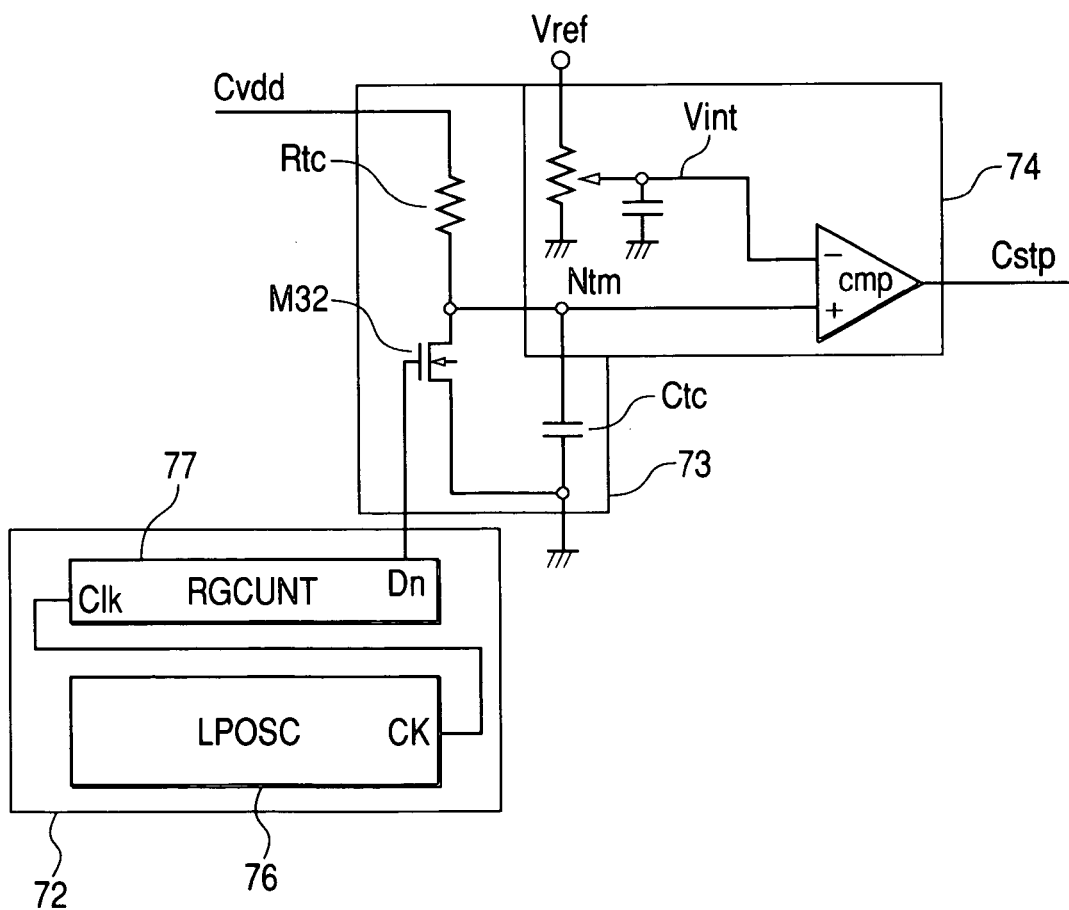
FIG. 28 is a circuit diagram showing another example of the interval generator circuit 71.

FIG. 28 shows another example of the interval generator circuit (ITVG) 71. The CR time constant circuit 73 is configured to have a series circuit of the resistor Rtc which is connected to the clamp voltage Cvdd and the capacitor Ctc to which an n-channel MOS switch M32 is connected in parallel. The MOS switch M32 is brought into the ON state in response to the HIGH level of the count-up pulse Fstr, whereby the Ctc is discharged. The MOS switch M32 is brought into the OFF state in response to the LOW level of the count-up pulse Fstr, whereby the Ctc is charged. The charge/discharge voltage obtained by the time constant circuit 73 is shown as Ntm. The time constant which defines the charge/discharge time is determined by trimming the value of the resistor Ttc. As for the other components, they are the same as in FIG. 26.

Figure 29:
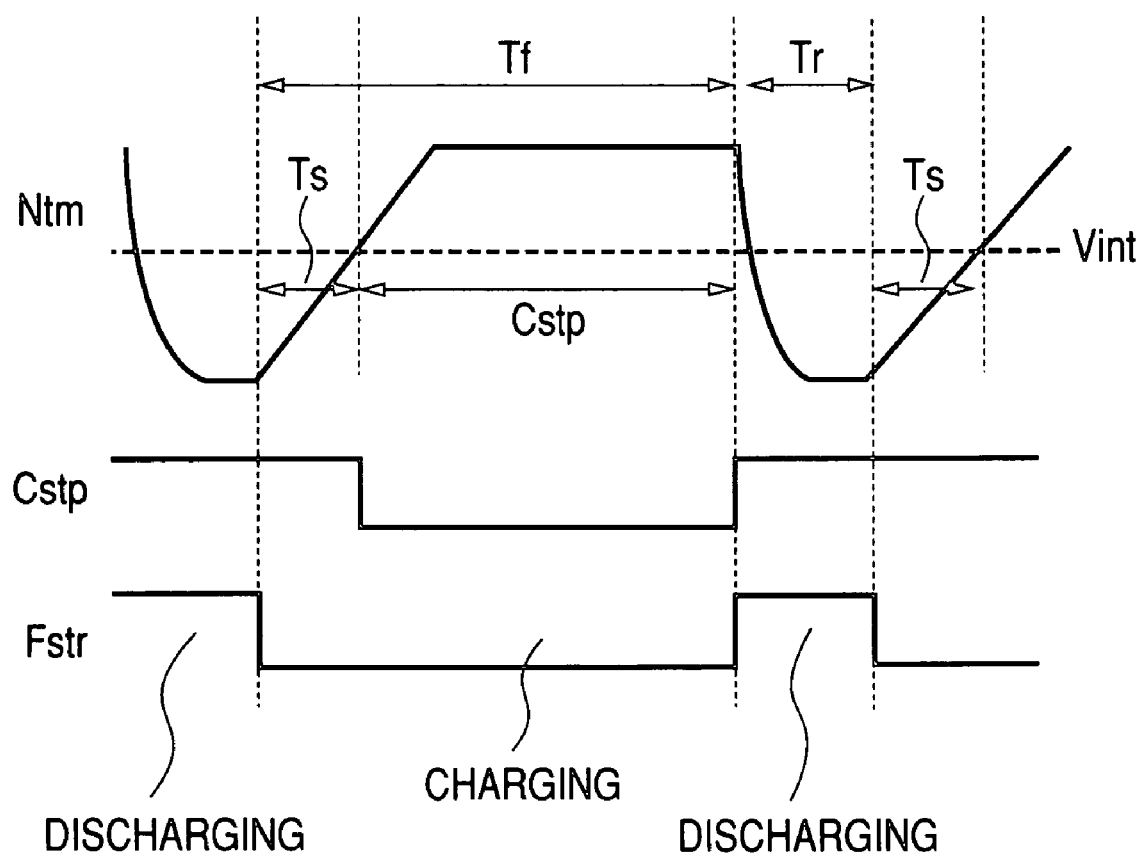
FIG. 29 is a timing chart for illustrating the fixed interval (Ts) generated through the charging/discharging operation of the time constant circuit of FIG. 28.

The charge voltage obtained by the CRTC 73 is defined by the clamp voltage Cvdd and stabilized relative to variations in temperature and power supply voltage Vcc. The time constant defined by the resistor Rtc and the capacitor Ctc do not depend on variations in temperature and power supply voltage Vcc. The judgment level Vint does not depend on variations in temperature and power supply voltage Vcc, either. Accordingly, as shown in FIG. 29, the time Ts from the initiation of charging by the time constant circuit till the voltage Ntm reaches the judgment level Vint is fixed. It is assumed that the fixed interval spans from the falling edge of Fstr to the outputting of a coincidence (the falling edge of Cstp) from the detector circuit. The time Ts is assumed to be a time of, e.g., 100 ms. Thus, in the configuration of FIG. 28 also, it becomes possible to dynamically adjust the oscillation frequency of the oscillator circuit 23 by using the fixed interval Ts as a reference in each cycle of the pulse Fstr without being influenced by variations in temperature and power supply voltage Vcc such that it coincides with a target frequency, in the same manner as in FIG. 26.

The application of the internal oscillator circuit module described heretofore to a semiconductor integrated circuit achieves the following effects.

Since an arbitrary internal clock signal requested by the user can be generated, such external components as a crystal oscillator, a capacitor, and the like are no more necessary so that board design becomes easier.

A frequency which is stable relative to a variation in fabrication process, a temperature change, and a power supply variation can be obtained through internal oscillation.

Since terminals for frequency sampling can be multiplexed with other terminals, the number of external terminals can be reduced by 2 compared with the case where a crystal oscillator is used.

Since the purchaser of the semiconductor integrated circuit is allowed to set the oscillation frequency, the purchaser has a sufficient period of time to design an application system and the flexibility of the design of the application system is improved.

Since there is no need to incorporate a frequency into the microcomputer at the design stage thereof and the design of a versatile microcomputer is allowed, design cost and the like can be reduced.

Since there is no terminal for an oscillator, EMS and EMI characteristics can be improved. Since an oscillator is not used, lower power consumption is achievable.

Since the mask ROM 6 is used, manufacturing cost can be reduced compared with the case where a flash memory is used. In addition, the microcomputer comprising the non-volatile memory cells formed by a CMOS process is used so that a greater reduction in manufacturing cost is achievable than in the case where a flash memory cell is used.

A description will be given next to another example of the configuration of the fuse module 6*cd* shown in FIG. 1.

Figure 11:
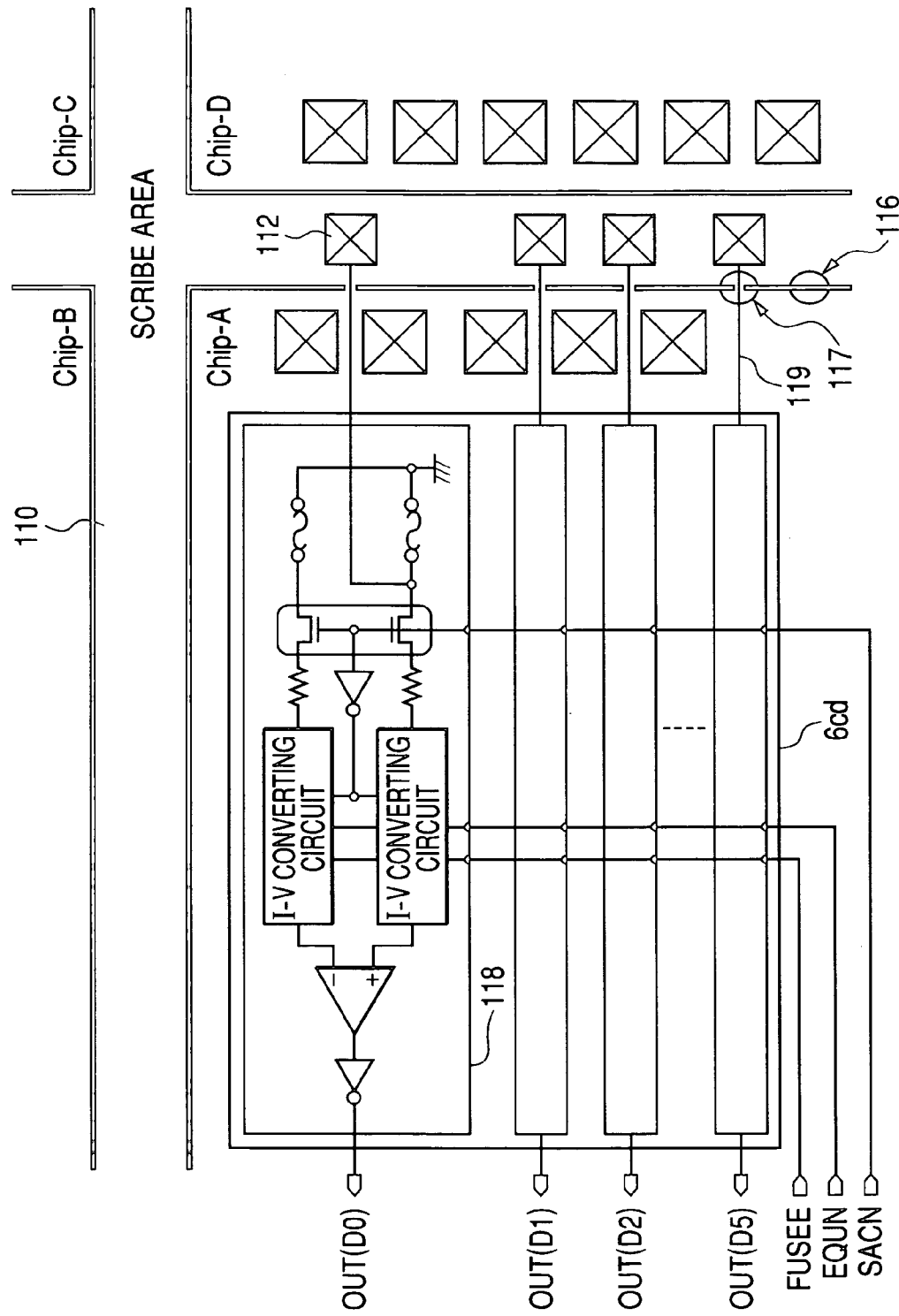
FIG. 11 is a block diagram of an example of the configuration of a fuse module containing a blow fuse circuit.

The fuse module 6cd can be composed of a blow fuse circuit comprising blow fuses that can be blown (broken) through energization. The blow fuses can be formed from, e.g., polycrystalline silicon or the like. FIG. 11 shows an example of the configuration of the fuse module 6cd obtained in that case. In the example shown in FIG. 11, four semiconductor chips Chip-A, Chip-B, Chip-C, and Chip-D are obtained by cutting a wafer at a scribe area 110, though the configuration is not particularly limited to the example. Each of the semiconductor chips Chip-A, Chip-B, Chip-C, and Chip-D is formed into the microcomputer 1 shown in, e.g., FIG. 1, FIG. 2, or the like. The fuse module 6cd contained therein comprises six blow fuse circuits 118 corresponding to outputs OUT (D0) to OUT (D5). Each of the six blow fuse circuits 118 contains a blow fuse which can be blown (broken) through energization. In the vicinity of the blow fuse circuits 118, a plurality of blow voltage application pads 112 for breaking the blow fuses by energizing them are formed. The formation of the plurality of blow voltage application pads 112 in the scribe area 110 allows the number of all pads in the semiconductor chip to be reduced by the number of the blow voltage application pads 112. Since the plurality of blow voltage application pads 112 are required only for the writing of control information in the blow fuse circuits 118 prior to dicing, there should be no problem even though they are removed by dicing.

Figure 12A:
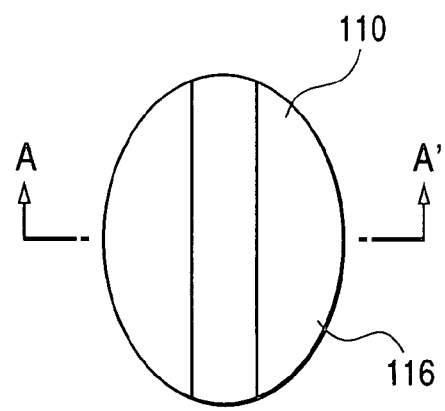
FIG. 12A is an enlarged view of the principal portion of FIG. 11.
Figure 12B:
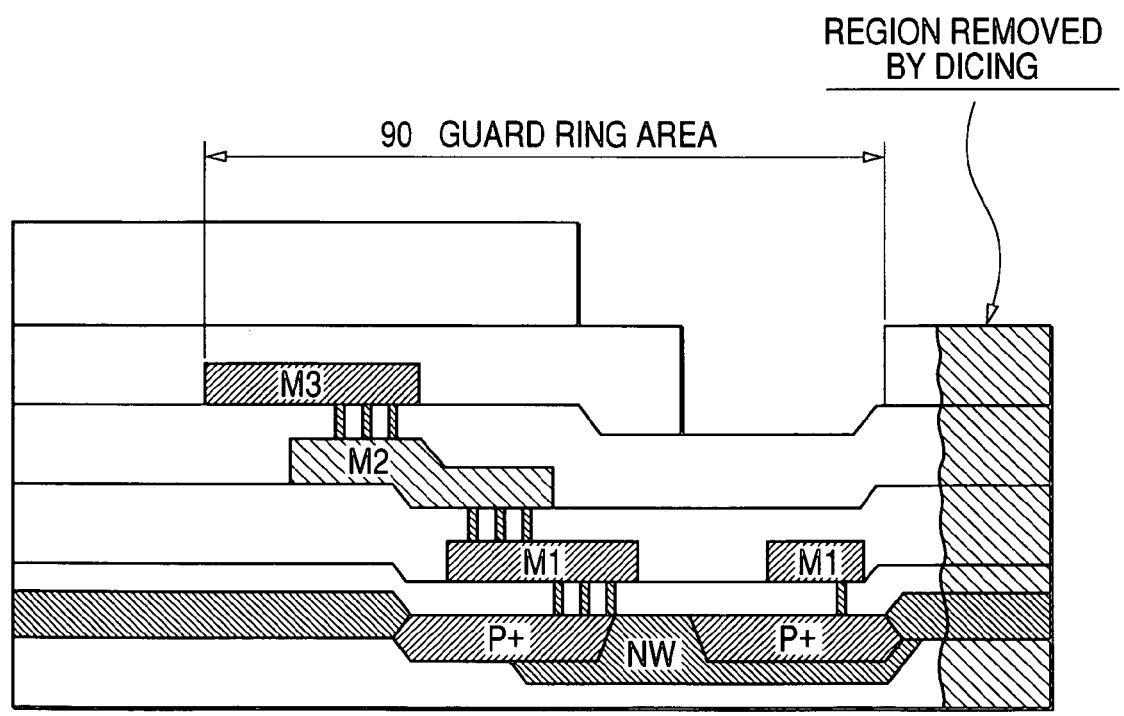
FIG. 12B is a cross-sectional view taken along the line A–A' of FIG. 12A.
Figure 12C:
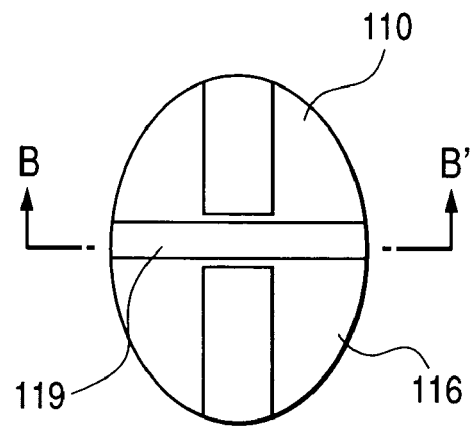
FIG. 12C is an enlarged view of the principal portion of FIG. 11.
Figure 12D:
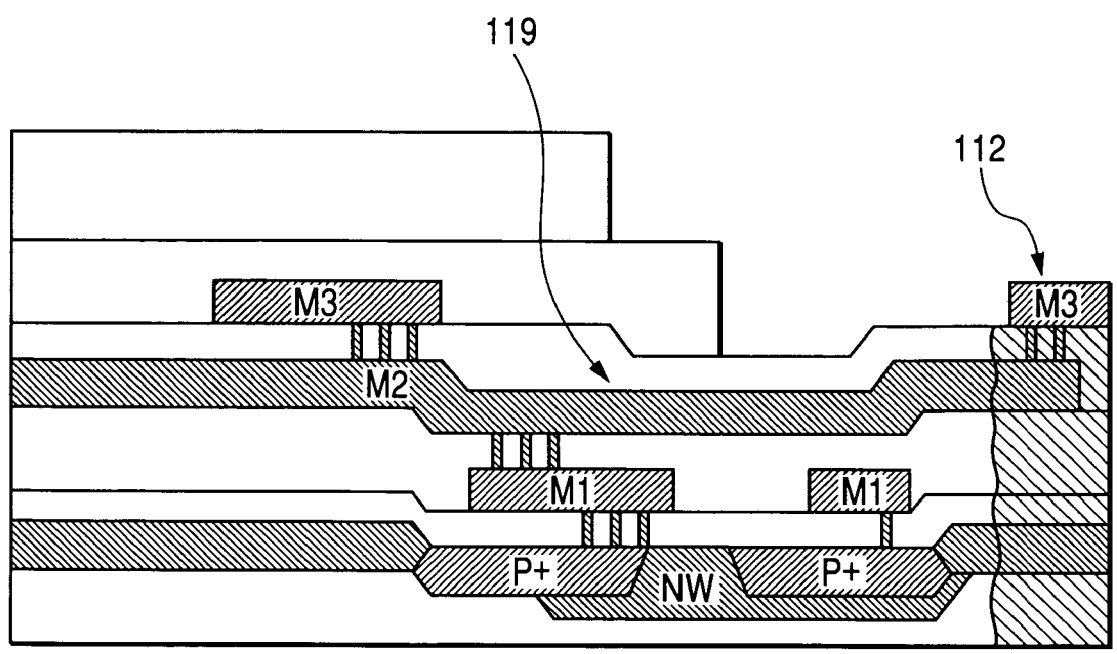
FIG. 12D is a cross-sectional view taken along the line B–B' of FIG. 12C.

FIG. 12A shows an enlarged view of the portion denoted by 116 in FIG. 11. FIG. 12B shows a cross section taken along the line A–A' of FIG. 12A. FIG. 12C shows an enlarged view of the portion denoted by 117 in FIG. 11. FIG. 12D shows a cross section taken along the line B–B' of FIG. 12C.

The peripheral portion of each of the semiconductor chips Chip-A, Chip-B, Chip-C, and Chip-D is formed with a guard ring area for preventing the entrance of moisture or the like into the chip after dicing. As denoted by 90 in FIG. 12B, the guard ring area is composed of a diffusion layer P+, a first-layer metal wire M1, a second-layer metal wire M2, and a third-layer metal wire M3 which are connected to each other via contact holes for providing conduction. However, the configuration of the guard ring area 90 is changed in a portion formed with a blow voltage application wire 119 which couples each of the blow fuse circuits 118 to the corresponding blow voltage application pad 112, as shown in FIG. 12D. Specifically, when the blow voltage application wire 119 is formed from the second-layer metal wire M2, the blow fuse circuit 118 and the blow voltage application pad 112 are coupled to each other via the second-layer metal wire M2 so that the blow voltage application wire (second-layer metal wire M2) 119 is excluded from the formation of the guard ring and is not coupled to another metal wiring layer at least in the guard ring area 90.

Figure 13:
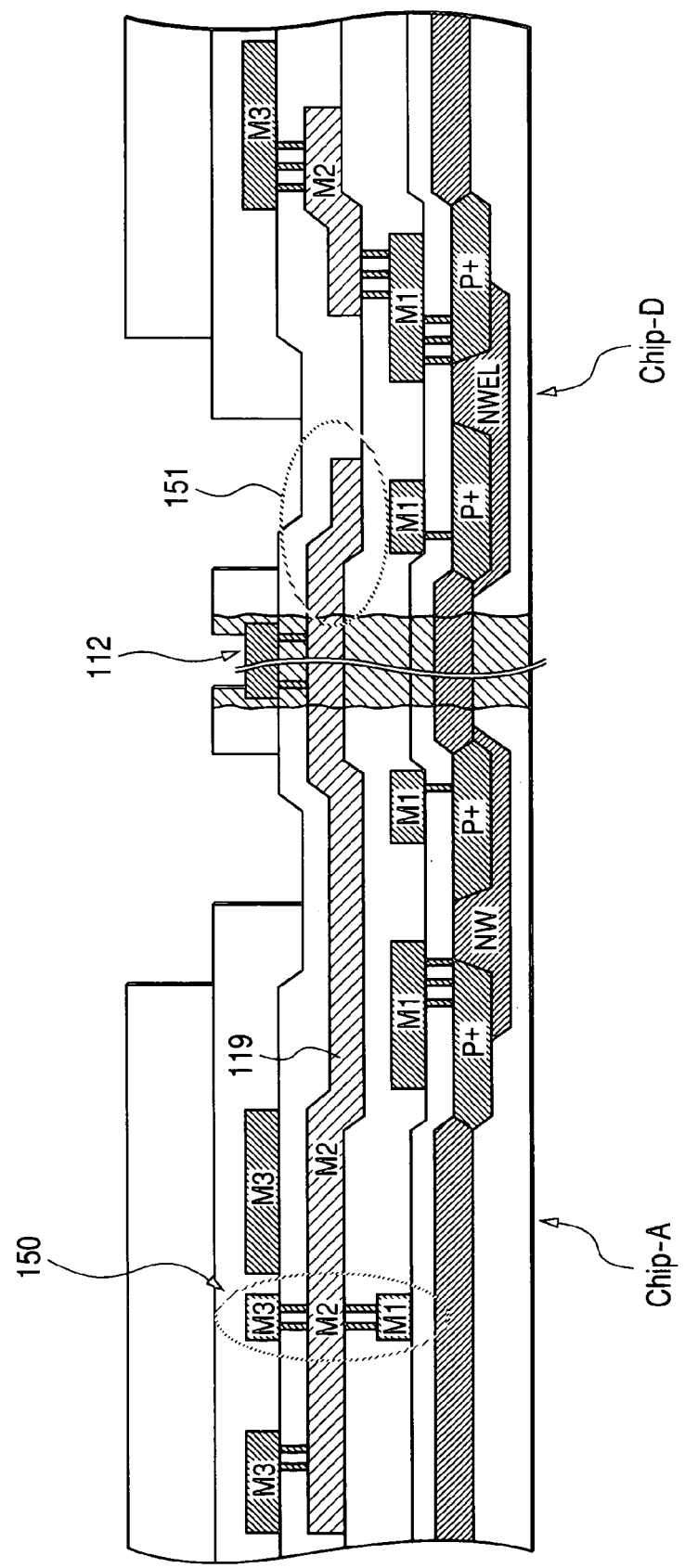
FIG. 13 is a cross-sectional view of another example of the configuration corresponding to FIG. 12D.

FIG. 13 shows a cross section of another example of the configuration corresponding to the cross section taken along the line B–B' of FIG. 12C.

The example shown in FIG. 13 is different from the example shown in FIG. 12D in that a dummy guard ring 150 including the blow voltage application wire 119 is formed and that the blow voltage application wire 119 has been formed in extended relation in the adjacent chip Chip-D, as indicated by 151. The dummy guard ring 150 is composed of the blow voltage application wire 119 connected to the wire M3 in the overlying layer and to the wire M1 in the underlying layer via contact holes for providing conduction. When such a dummy guard ring 150 is formed, the function of protecting the chip is enhanced compared with that obtained in the case shown in FIG. 12D.

Figure 17A:
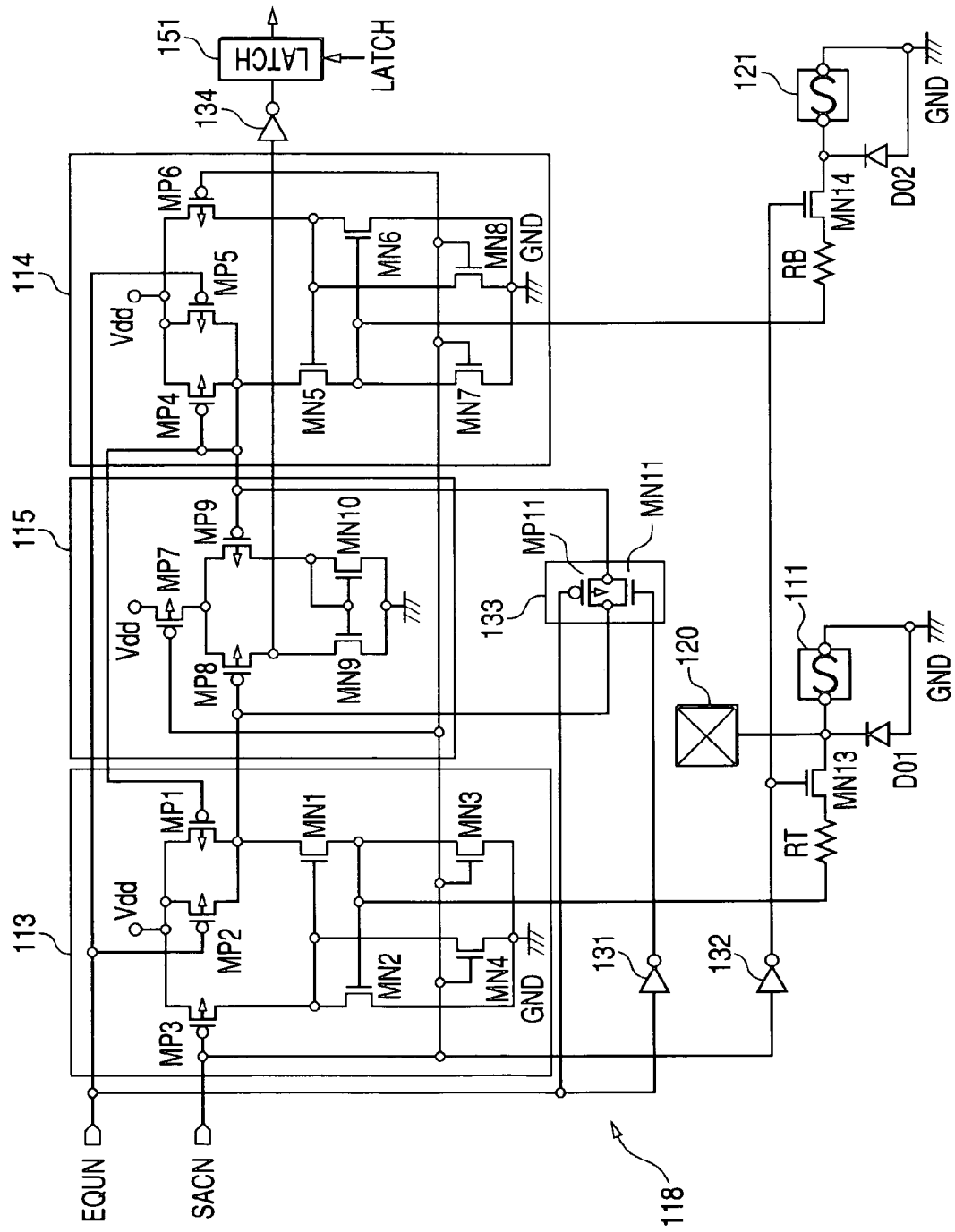
FIG. 17A is a circuit diagram of a detailed example of the configuration of the blow fuse circuit mentioned above.

FIG. 17A shows a detailed example of the configuration of one of the six blow fuse circuits 118.

As shown in FIG. 17A, the blow fuse circuit 118 comprises: a blow fuse 111 for writing information; an I-V (current-voltage) converter circuit 113 for converting a current flowing in the blow fuse 111 for writing information to a voltage; a blow fuse 121 for reference which is equivalent to the unblown state of the blow fuse for writing information; an I-V converter circuit 114 capable of converting a current flowing in the blow fuse 121 for reference to a voltage; and a sense amplifier 115 for comparing an output voltage of the I-V converter circuit 114 with an output voltage of the I-V converter circuit 114. A series circuit of an n-channel MOS transistor MN13 and a resistance RT is provided between the I-V converter circuit 113 and the blow fuse 111 for writing information. On the other hand, a series circuit of an n-channel MOS transistor MN14 and a resistance RB is provided between the I-V converter circuit 114 and the blow fuse 121 for reference. A sense amplifier enable signal SACN is supplied to the gate electrode of each of the n-channel MOS transistors MN13 and MN14 via an inverter 132 composed of a p-channel MOS transistor and an n-channel MOS transistor which are connected in series. The resistance RB is set to be larger than the resistance RT. This allows a reference-side voltage in a voltage comparing operation in the sense amplifier 115 to be set to a proper level and thereby allows reliable judgment to be made when the blow fuse 111 for writing information has not been blown.

The blow fuse 111 for writing information has one end coupled to the blow voltage application pad 120 and the other end coupled to a ground line GND. The blow fuse 111 for writing information is blown by a specified blow voltage supplied thereto via the blow voltage application pad 120. At this time, the n-channel MOS transistor MN13 is turned OFF by turning OFF the sense amplifier enable signal SACH or the power supply of the LSI such that the blow voltage is not supplied to the input terminal of the I-V converter circuit 113.

The blow fuse 121 for reference is provided for a current comparison made between itself and the blow fuse 111 for writing information so that the blowing of the blow fuse 121 for reference through energization is not performed. Accordingly, there is no need to connect a pad for supplying a blow voltage to the blow fuse 121 for reference. The n-channel MOS transistor MN14 is provided for a balance between the blow fuse 121 for reference and the blow fuse 111 for writing information, though a blow voltage is not supplied to the blow fuse 121 for reference. Diodes DO1 and D02 are provided to prevent a voltage at a node from reaching an undesired level.

The I-V converter circuit 113 mentioned above is composed of the p-channel MOS transistors MP1, MP2, and MP3 and the n-channel MOS transistors MN1, MN2, MN3, and MN4 which are coupled to each other, though the components thereof are not particularly limited. The p-channel MOS transistors MP1 and MP2 are connected in parallel and the n-channel MOS transistors MN1 and MN3 are connected in series thereto. The p-channel MOS transistor MP3 and the n-channel MOS transistor MN2 are connected in series. An equalize enable signal EQUN is transmitted to the gate electrode of the p-channel MOS transistor MP2. The sense amplifier enable signal SACN for indicating the activation of the sense amplifier 115 is transmitted to the gate electrode of each of the p-channel MOS transistor MP3 and the n-channel MOS transistors MN3 and MN4. The drawing of a current from the series connection node between the n-channel MOS transistors MN1 and MN3 via the n-channel MOS transistor MN13 causes a change in the gate potential of the n-channel MOS transistor MN2 and a potential at the series connection node between the p-channel MOS transistor MP1 and the n-channel MOS transistor MN1 is determined responsively. When the fuse 111 has been blown, e.g., the drawing of the current via the n-channel MOS transistor MN13 is not performed so that the potential at the series connection node between the p-channel MOS transistor MP1 and the n-channel MOS transistor MN1 is set to a high voltage level. When the fuse 111 has not been blown, however, the drawing of the current is performed via the n-channel MOS transistor MN13 so that the potential at the series connection node between the p-channel MOS transistor MP1 and the n-channel MOS transistor MN1 is set to a low voltage level. In other words, the potential at the series connection node between the p-channel MOS transistor MP1 and the n-channel MOS transistor MN1 is determined depending on an amount of the current drawn via the n-channel MOS transistor MN13 and the determined potential is transmitted as the output voltage of the I-V converter circuit 113 to the sense amplifier 115. The operation of each of the n-channel MOS transistors MN13 and MN14 is controlled by the sense amplifier enable signal SACN.

The I-V converter circuit 114 is composed of p-channel MOS transistors MP4, MP5, and MP6 and n-channel MOS transistors MN5, MN6, MN7, and MN8 which are coupled to each other, though the components thereof are not particularly limited. Basically, the I-V converter circuit 114 is configured similarly to the I-V converter circuit 113 described above. However, the gate electrode of each of the p-channel MOS transistors MP1 and MP4 is connected commonly to the series connection node between the p-channel MOS transistor MP4 and the n-channel MOS transistor MN5. The arrangement is for stabilizing the comparing operation in the sense amplifier 115 by setting the output voltage (the voltage at the series connection node between MP4 and MN5) of the I-V converter circuit 114 in the state in which the blow fuse 121 for reference has not been blown to a level slightly higher than the output voltage of the I-V converter circuit 114 in the state in which the blow fuse 111 writing information has not been blown because the output voltage of the I-V converter circuit 114 in the state in which the blow fuse 121 for reference has not been blown is used as a reference voltage.

The sense amplifier 115 is composed of p-channel MOS transistors MP7, MP8, and MP9 and n-channel MOS transistors MN9 and MN10 which are coupled to each other. The p-channel MOS transistors MP8 and MP9 are differentially coupled. The p-channel MOS transistor MP7 is used as a common constant current source for the differentially coupled circuits (MP8 and MP9). The n-channel MOS transistors MN9 and MN10 are used as a load on the differentially coupled circuits (MP8 and MP9). The gate electrodes of the p-channel MOS transistors MP8 and MP9 are designed to be short-circuited by an equalize circuit 133 composed of a p-channel MOS transistor MP11 and an n-channel MOS transistor MN11 which are connected in parallel. The equalize enable signal EQUN is transmitted to the gate electrode of the p-channel MOS transistor MP11. An output signal from the sense amplifier is obtained from the series connection node between the p-channel MOS transistor MP8 and the n-channel MOS transistor MN9. The output signal from the sense amplifier is transmitted through an inverter 134 composed of a p-channel MOS transistor and an n-channel MOS transistor which are connected in series to a subsequent-stage circuit via a subsequent-stage latch circuit 151. The latch circuit 151 latches an input signal during the period during which a latch signal LATCH is at the HIGH level and outputs the latched signal to a subsequent-stage circuit.

The equalize enable signal EQUN is inverted in the inverter 131 and then transmitted to the gate electrode of the n-channel MOS transistor MN11. The inverter 131 is composed of a p-channel MOS transistor and an n-channel MOS transistor which are connected in series. The sense amplifier 115 is equalized through the short-circuiting of the gates of the p-channel MOS transistors MP8 and MP9 during the period during which the equalize enable signal EQUN is at the HIGH level.

Figure 17B:
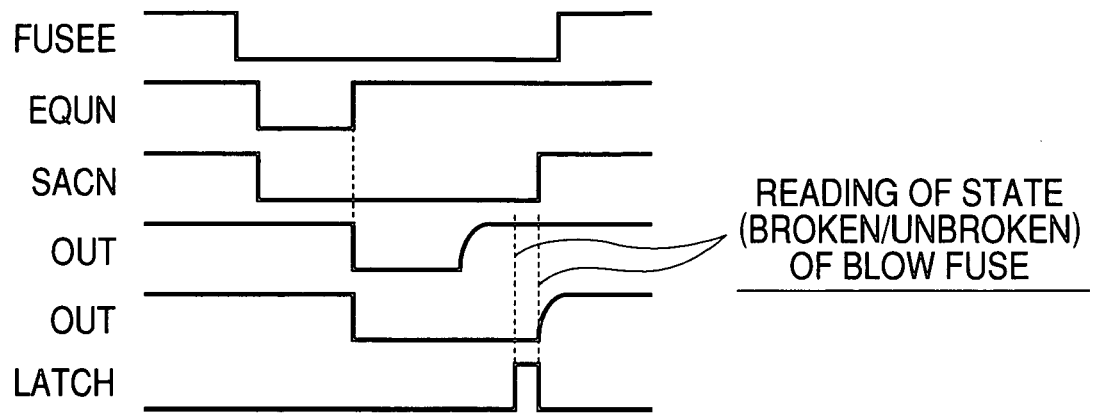
FIG. 17B is a timing chart for the operation of the principal portion of the blow fuse circuit mentioned above.

FIG. 17B shows the timing of a reading operation to the blow fuse circuit 118 shown in FIG. 17A.

It is assumed that the blow fuse circuit 118 is brought into an enable state with a fuse enable signal FUSEE being brought to the LOW level. In the enable state of the blow fuse circuit 118, the sense amplifier 115 is brought into an operable state with the sense amplifier enable signal SACN being brought to the LOW level. The sense amplifier 115 is equalized with the equalize enable signal EQUN being brought to the LOW level. After the equalization is completed, the reading of data from the blow fuse circuit 118 is enabled. An output voltage of the sense amplifier 115 differs depending on whether or not the blow fuse circuit 111 for writing information has been blown. In the present example, the output of the inverter 134 is brought to the HIGH level when the blow fuse 111 for writing information has been blown, while it is brought to the LOW level when the blow fuse 111 for writing information has not been blown.

Figure 17C:
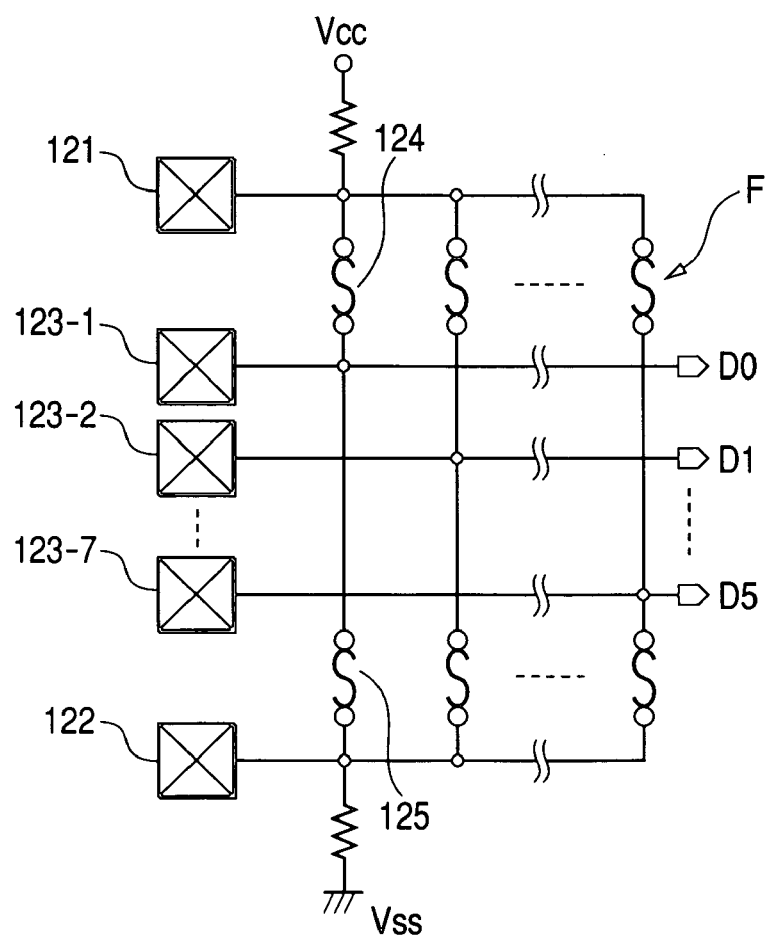
FIG. 17C is a circuit diagram of an example of the configuration of a circuit to be compared with the blow fuse circuit shown in FIG. 17A.

FIG. 17C shows a circuit to be compared with the blow fuse circuit 118 described above.

The circuit to be compared comprises: a plurality of voltage application pads 123-1 to 123-7 for blowing fuses; a common P terminal; a common M terminal; and fuses F composed of polysilicon (polycrystalline silicon) and provided between the respective voltage application pads 123-1 to 123-7 for blowing fuses and the common P terminal 121 and between the respective voltage application pads 123-1 to 123-7 for blowing fuses and the common M terminal 122. The blowing of each of the fuses is enabled by applying a specified voltage for blowing the fuse between the common P terminal 121 or the common M terminal 122 and the corresponding voltage application pad for blowing the fuse. For example, the fuse 124 closer to a higher-potential power supply Vcc can be blown by applying the specified voltage for blowing the fuse between the voltage application pad 123-1 for blowing the use and the common P terminal 121 and the fuse 5 closer to a low-potential power supply Vss can be blown by applying the specified voltage for blowing the fuse between the voltage application pad 123-1 for blowing the fuse and the common M terminal 122. When the fuse 4 closer to the higher-potential power supply Vcc is blown, the output data set D0 is brought to the LOW level. The output data set D0 is brought to the HIGH level when a fuse 125 closer to the lower-potential power supply Vss is blown. By thus blowing the fuse closer to the higher-potential power supply Vcc or the lower-potential power supply Vss, the logic of each of the output data sets D0 to D5 can be determined.

However, when the blowing of the fuse is incomplete, there is the possibility that a through current flows and the output data has an undesired logic. For example, when the fuse 125 closer to the lower-potential power supply Vss has not been blown completely, a through current flows via the fuses 124 and 125. Although the output data D0 at this time should naturally be at the HIGH level, there may be a case where the output data D0 is at the LOW level due to a flow of the through current.

By contrast, the blow fuse circuit 118 described above comprises: the blow fuse 111 for writing information; the I-V (current-voltage) converter circuit 113 for converting a current flowing in the blow fuse 111 for writing information to a voltage; the blow fuse 121 for reference which is equivalent to the unblown state of the blow fuse for writing information; the I-V converter circuit 114 capable of converting a current flowing in the blow fuse 121 for reference to a voltage; and the sense amplifier 115 for comparing the output voltage of the I-V converter circuit 113 with the output voltage of the I-V converter circuit 114. Since the state of the blow fuse 121 for reference which is equivalent to the unblown state of the blow fuse for writing information is referenced, when the blowing of the blow fuse 111 for writing information is incomplete, a voltage corresponding to a current flowing via the n-channel MOS transistor MN13 is outputted from the I-V converter circuit 113. The outputted voltage is compared with the reference voltage (the output voltage of the I-V converter circuit 114) in the sense amplifier 115 so that the judgment of the logic of the read data is enabled in terms of the reference voltage irrespective of incomplete blowing of the blow fuse 111 for writing information. In addition, the use of the sense amplifier signal SACN to control the period of a read operation to the fuse prevents an undesired through current from flowing quantitatively.

Although the invention achieved by the present inventors has been described specifically based on the embodiments thereof, the present invention is not limited to the embodiments thereof described above. It will easily be appreciated that various changes and modifications can be made in the invention without departing from the gist thereof.

For example, the PLSG 72 of FIG. 26 may also be composed of a circuit external of the semiconductor integrated circuit. The semiconductor integrated circuit is not limited to the microcomputer. The prevent invention is widely applicable to a semiconductor integrated circuit which requires a clock signal for a synchronous operation, such as represented by a system-on-chip LSI having a CPU. The reference voltage generator circuit may be a band-gap reference voltage generator circuit using a bipolar transistor. The internal circuit module of the data processing LSI represented by the microcomputer is not limited to that shown in FIG. 1 and may be modified appropriately if necessary.

Although only the trimming control information for the internal clock signal is stored in the fuse module 6cd in the examples described above, another control information may also be stored therein. For example, when the power supply voltage supplied from the outside is 5 V and supplied to the internal circuit after it is dropped to 3.3 V in an in-chip voltage dropping circuit, the trimming of the voltage dropping circuit becomes necessary. In such a case, the trimming of the voltage dropping circuit can be performed in the same manner as in the case of trimming the internal clock signal by storing trimming control information for the voltage dropping circuit in a region of the fuse module 6cd other than the region in which the trimming information for the internal clock signal is stored and reading the trimming control information for the voltage dropping circuit in response to power-on reset.

What is claimed is:

1. A semiconductor integrated circuit comprising:

a memory circuit;

an oscillator circuit for generating an internal clock signal based on control information held in said memory circuit;

a logic circuit for generating control information for causing a frequency of the internal clock signal to coincide with a frequency of an external clock signal which is generated externally; and an electric fuse circuit containing a nonvolatile memory cell formed in a CMOS process and capable of storing the control information generated in said logic circuit, wherein the control information stored in said electric fuse circuit is stored in said memory circuit and said internal clock signal is used for a synchronous operation of an internal circuit.

2. A semiconductor integrated circuit according to claim 1, wherein said electric fuse circuit includes a first memory region capable of storing trimming control information for said internal clock signal and a second memory region capable of storing other trimming control information related to said internal circuit.

3. A semiconductor integrated circuit according to claim 2, wherein the control information generated in said logic circuit is stored in said electric fuse at a final stage of an internal-oscillation-frequency setting operation.

4. A semiconductor integrated circuit according to claim 3, wherein said internal circuit contains a mask ROM capable of storing a control program.

5. A semiconductor integrated circuit according to claim 4, wherein the control information stored in said electric fuse is loaded into said memory circuit in response to an initializing operation for said semiconductor integrated circuit.

6. A semiconductor integrated circuit comprising:

a memory circuit;

an oscillator circuit for generating an internal clock signal based on control information held in said memory circuit;

a logic circuit for generating control information for causing a frequency of the internal clock signal to coincide with a frequency of an external clock signal which is generated externally; and a blow fuse circuit capable of storing said control information by using a state of a blow fuse, wherein the control information stored in said blow fuse circuit is loaded into said memory circuit and said internal clock signal is used for a synchronous operation of an internal circuit.

7. A semiconductor integrated circuit according to claim 6, wherein said blow fuse circuit includes:

a blow fuse for writing information which enables writing of said control information by being blown or not being blown; and a blow fuse for reference which is equivalent to an unblown state of said blow fuse for writing information, wherein said blow fuse circuit compares a current flowing in said blow fuse for writing information with a current flowing in said blow fuse for reference to form a logic output in accordance with a result of the comparison.

8. A semiconductor integrated circuit according to claim 6,
wherein said blow fuse circuit includes:
a blow fuse for writing information which enables writing of said control information by being blown or not being blown;
a first converter circuit for converting a current flowing in said blow fuse for writing information to a voltage;
a blow fuse for reference which is equivalent to an unblown state of said blow fuse for writing information;
a second converter circuit for converting a current flowing in said blow fuse for reference to a voltage; and
a sense amplifier for comparing an output voltage of said first converter circuit with an output voltage of said second converter circuit.

9. A semiconductor integrated circuit according to claim 7, further comprising:
a first transistor capable of cutting off a path from said blow fuse for writing information to said first converter circuit during a period during which said blow fuse for writing information is energized for the writing of said control information; and
a second transistor capable of cutting off a path from said blow fuse for reference to said second converter circuit in association with said first transistor.

10. A semiconductor integrated circuit according to claim 9, further comprising:
a fist resistance provided between said first transistor and said first converter circuit; and
a second resistance provided between said second transistor and said second converter circuit,
wherein a value of said second resistance is set to be larger than a value of said first resistance.

11. A semiconductor integrated circuit according to claim 1, wherein said logic circuit generates control information in response to an indication of a specified operation mode.

12. A semiconductor integrated circuit according to claim 11, wherein said logic circuit performs an operation of generating the control information in synchronization with a clock signal generated based on the control information initially given to said memory circuit.

13. A semiconductor integrated circuit according to claim 11, wherein said logic circuit performs an operation of generating the control information in synchronization with the external clock signal.

14. A semiconductor integrated circuit according to claim 11, wherein said logic circuit performs an operation of generating the control information in synchronization with a clock signal generated in another oscillator circuit which is operated to oscillate in response to the indication of the specified operation mode.

15. A semiconductor integrated circuit according to claim 1, further comprising:
a sampling circuit for sampling information responsive to the frequency of the internal clock signal and to the frequency of the external clock signal,
wherein said logic circuit makes a frequency comparison between the internal clock signal and the external clock signal by using the information sampled by said sampling circuit and generates control information for causing the frequency of the internal clock signal to coincide with the frequency of the external clock signal.

16. A semiconductor integrated circuit according to claim 1, further comprising:
a comparator circuit for detecting a frequency difference between the internal clock signal and the external clock signal through a comparison made therebetween,
wherein said logic circuit generates control information for causing the frequency of the internal clock signal to coincide with the frequency of the external clock signal by using a result of the comparison by said comparator circuit.

17. A semiconductor integrated circuit according to claim 15, wherein said logic circuit is a CPU and said memory circuit is a register accessible by said CPU.

18. A semiconductor integrated circuit according to claim 1,
wherein said memory circuit is a counter and
wherein said logic circuit detects a frequency difference between the internal clock signal and the external clock signal through a comparison made therebetween and up-counts or down-counts said counter by using a result of the comparison.

* * * * *